United States Patent
Cheng et al.

(10) Patent No.: US 12,501,596 B1
(45) Date of Patent: Dec. 16, 2025

(54) ELECTROMAGNETIC INTERFERENCE (EMI) SHIELDING IN OPTICAL SENSORS

(71) Applicant: STMicroelectronics International N.V., Geneva (CH)

(72) Inventors: Kai Quan Cheng, Singapore (SG); Tat Ming Teo, Singapore (SG); Andrew John Price, Midlothian (GB); Laurent Schwartz, La buisse (FR); Maxime Pailhes, Sillans (FR); Patrick Laurent, Tullins (FR)

(73) Assignee: STMicroelectronics International N.V., Geneva (CH)

( * ) Notice: Subject to any disclaimer, the term of this patent is extended or adjusted under 35 U.S.C. 154(b) by 6 days.

(21) Appl. No.: 18/742,247

(22) Filed: Jun. 13, 2024

(51) Int. Cl.
*H05K 9/00* (2006.01)
*H01L 23/552* (2006.01)

(52) U.S. Cl.
CPC ......... *H05K 9/0094* (2013.01); *H01L 23/552* (2013.01); *H05K 9/0032* (2013.01); *H05K 9/0037* (2013.01); *H05K 9/0084* (2013.01)

(58) Field of Classification Search
CPC ... H05K 9/0037; H05K 9/0094; H01L 23/552
See application file for complete search history.

(56) References Cited

U.S. PATENT DOCUMENTS

| | | | |
|---|---|---|---|
| 11,662,223 B2 * | 5/2023 | Pajkic | H10F 77/407 |
| | | | 324/693 |
| 2009/0243051 A1 * | 10/2009 | Vanam | H10F 39/80 |
| | | | 257/659 |
| 2011/0261550 A1 * | 10/2011 | Wong | H01L 24/19 |
| | | | 264/272.17 |
| 2016/0113161 A1 | 4/2016 | Ball et al. | |
| 2017/0127581 A1 | 5/2017 | Figueredo et al. | |
| 2017/0347462 A1 | 11/2017 | Miwa | |
| 2017/0354039 A1 | 12/2017 | Miwa | |
| 2020/0194379 A1 * | 6/2020 | Kim | H01L 23/66 |
| 2021/0175180 A1 * | 6/2021 | Mischke | H01L 25/167 |
| 2023/0115690 A1 | 4/2023 | Shi et al. | |
| 2023/0197702 A1 * | 6/2023 | Deng | H10F 77/413 |
| 2023/0369239 A1 | 11/2023 | Chen | |

* cited by examiner

*Primary Examiner* — Hung V Ngo
(74) *Attorney, Agent, or Firm* — ALSTON & BIRD LLP

(57) ABSTRACT

Methods, systems, and apparatuses for electromagnetic interference (EMI) shielding are provided. An apparatus comprises a plurality of electrical components coupled to a substrate. The plurality of electrical components comprises a first electrical component coupled to a first region of the substrate and at least one other electrical component coupled to at least one other region of the substrate. The first electrical component is configured to emit electromagnetic waves. The apparatus also comprises an EMI shield forming a conductive envelopment around the first region. The first electrical component is inside the conductive envelopment and the one other electrical component is outside of the conductive envelopment. The EMI shield comprises an aperture positioned above the first electrical component. The apparatus further comprises a lens coupled to the EMI shield. The lens is positioned above the first electrical component and is substantially aligned with the aperture.

20 Claims, 12 Drawing Sheets

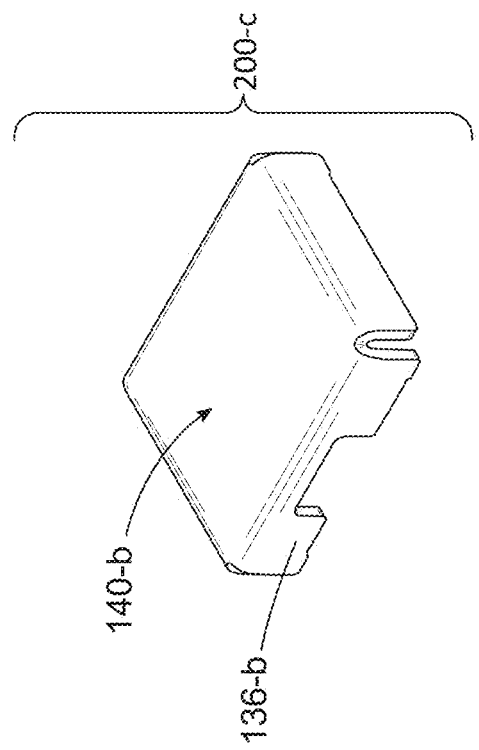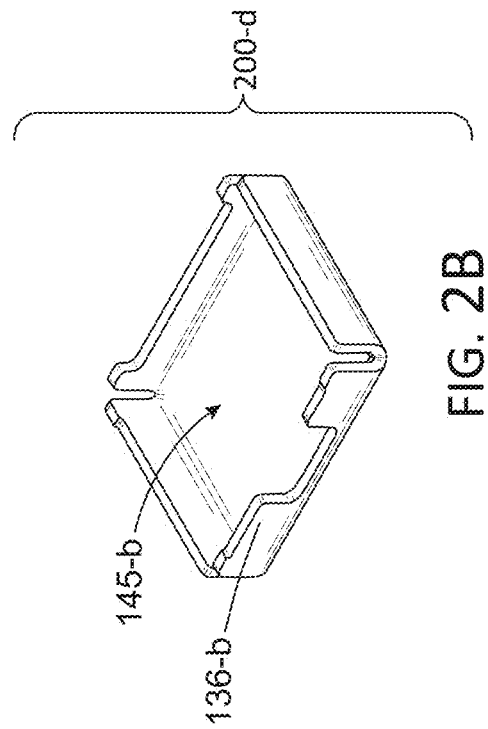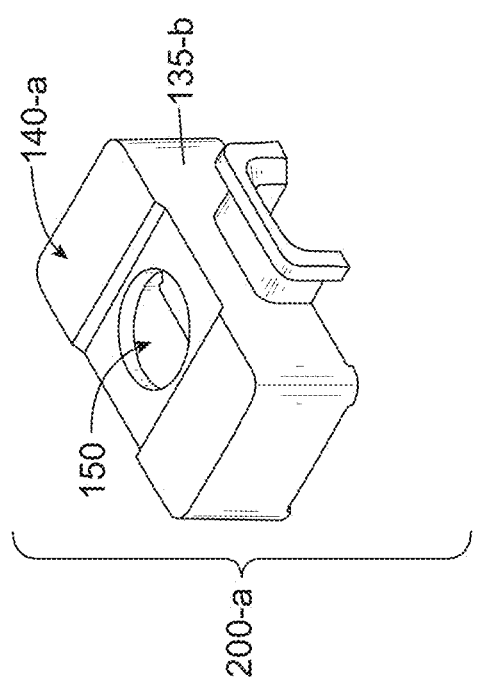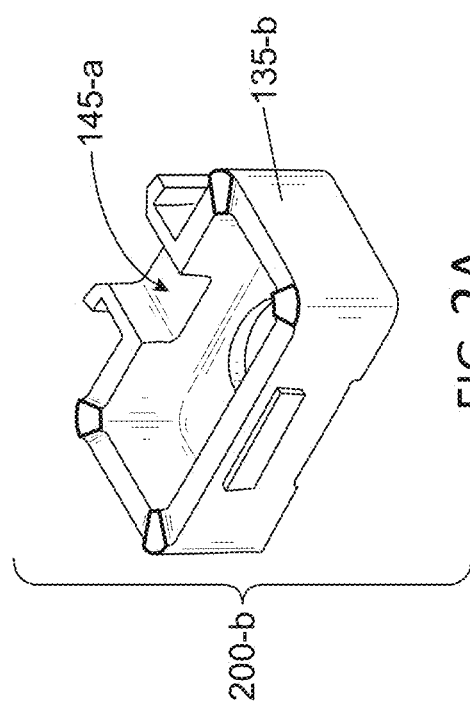
FIG. 2A
FIG. 2B

ELECTROMAGNETIC INTERFERENCE (EMI) SHIELDING IN OPTICAL SENSORS

TECHNOLOGICAL FIELD

Example embodiments of the present disclosure relate generally to electromagnetic interference (EMI) shielding and, more particularly, to EMI shields that form localized conductive envelopments within an optical sensor.

BACKGROUND

EMI shielding creates a Faraday cage effect which attenuates radiation of electromagnetic (EM) waves and/or reduces a likelihood of EM emissions from circuit components on a circuit board from being emitted outside of the circuit board. In some cases, conductive metal cans, which are commonly fabricated through stamping sheets of metallic material, can be used for EMI shielding. In some cases, however, stamping fabrication techniques are constrained, and cannot form metal cans with relatively sharp corners (e.g., right angle corners). Consequently, corners of metal cans fabricated through stamping have a relatively wide radius, which increases the footprint of the resultant EMI shield. Multiple metal cans may be used to reduce the footprint of the EMI shield. In some cases, however, multiple metal cans introduce gaps through which EM waves may leak, particularly at higher frequencies, thereby increasing EMI. In some cases, an EMI shield may be introduced into packaging of a device, such as an optical sensor. In such cases, however, the EMI shield may fail to prevent internal EMI cross-talk between electrical components within the same EMI shield. Additionally, in some cases, package-level EMI shielding leads to increased material and assembly costs.

The inventors have identified numerous areas of improvement in the existing technologies and processes, which are the subjects of embodiments described herein. Through applied effort, ingenuity, and innovation, many of these deficiencies, challenges, and problems have been solved by developing solutions that are included in embodiments of the present disclosure, some examples of which are described in detail herein.

BRIEF SUMMARY

Various embodiments described herein relate to improved EMI shielding (e.g., for optical sensors).

In accordance with some embodiments of the present disclosure, an example apparatus is provided. The example apparatus comprises:
  a plurality of electrical components coupled to the substrate, wherein the plurality of electrical components comprises a first electrical component coupled to a first region of the substrate and at least one other electrical component coupled to at least one other region of the substrate, and wherein the first electrical component is configured to emit electromagnetic waves;
  a first electromagnetic interference (EMI) shield forming a first conductive envelopment around at least the first region, wherein the first electrical component is inside the first conductive envelopment and the at least one other electrical component is outside of the first conductive envelopment, and wherein the first EMI shield comprises a first aperture positioned above the first electrical component; and
  a lens coupled to the first EMI shield, wherein the lens is positioned above the first electrical component, and wherein the lens is substantially aligned with the first aperture.

In some embodiments, the example apparatus comprises a second EMI shield forming a second conductive envelopment around a second region of the substrate, wherein the plurality of electrical components comprises a second electrical component coupled to the second region of the substrate, wherein the second electrical component is inside the second conductive envelopment, and wherein the second electrical component is configured to emit electromagnetic waves.

In some embodiments, the first EMI shield comprises a first protrusion that extends towards the second EMI shield, the second EMI shield comprises a second protrusion that extends towards the first EMI shield, and at least a first portion of the first protrusion is positioned under at least a second portion of the second protrusion.

In some embodiments, the first EMI shield is configured to substantially isolate first electromagnetic waves associated with the first electrical component from the second electrical component; and the second EMI shield is configured to substantially isolate second electromagnetic waves associated with the second electrical component from the first electrical component.

In some embodiments, wherein the first EMI shield and the second EMI shield comprise metal.

In some embodiments, the plurality of electrical components comprises a second electrical component coupled to a second region of the substrate, the second electrical component is configured to emit electromagnetic waves, and the first EMI shield forms the first conductive envelopment around the first electrical component and at least a portion of the second electrical component.

In some embodiments, the first EMI shield comprises a resin, and wherein an underside of the first EMI shield comprises a metal layer that forms the first conductive envelopment.

In some embodiment, a thickness of the metal layer is about 1 micron to about 12 microns.

In some embodiments, the metal layer comprises at least one of the following: beryllium, copper, brass, steel, stainless steel, nickel, or silver.

In some embodiments, the first EMI shield comprises a protrusion that extends towards the second electrical component and is positioned above the portion of the second electrical component, and wherein the protrusion extends the first conductive envelopment around the portion of the second electrical component.

In some embodiments, the first electrical component comprises a laser diode and the second electrical component comprises a current source associated with the laser diode.

In some embodiments, wherein the first EMI shield comprises metal.

In accordance with some other embodiments of the present disclosure, an example system is provided. The example system comprises:
  an optical sensor and a cover coupled to a substrate of the optical sensor. The optical sensor comprises:
  the substrate;
  a plurality of electrical components coupled to the substrate, wherein the plurality of electrical components comprises a first electrical component coupled to a first region of the substrate and at least one other electrical component coupled to at least one other region of the substrate, and wherein the first electrical component is configured to emit electromagnetic waves;
a first electromagnetic interference (EMI) shield forming a first conductive envelopment around at least the first region, wherein the first electrical component is inside the first conductive envelopment and the at least one other electrical component is outside of the first conductive envelopment, and wherein the first EMI shield comprises a first aperture positioned above the first electrical component; and
a lens coupled to the first EMI shield, wherein the lens is positioned above the first electrical component, and wherein the lens is substantially aligned with the first aperture, wherein the cover forms an enclosure around the first region and the at least one other region of the substrate, wherein the first EMI shield is inside the enclosure, and wherein the cover comprises at least a second aperture that is substantially aligned with the lens.

In some embodiments, the optical sensor further comprises a second EMI shield forming a second conductive envelopment around a second region of the substrate, the plurality of electrical components comprises a second electrical component coupled to the second region of the substrate, the second electrical component is inside the second conductive envelopment, and the second electrical component is configured to emit electromagnetic waves.

In some embodiments, the first EMI shield comprises a first protrusion that extends towards the second EMI shield, the second EMI shield comprises a second protrusion that extends towards the first EMI shield, and at least a first portion of the first protrusion is positioned under at least a second portion of the second protrusion.

In some embodiments, the plurality of electrical components comprises a second electrical component coupled to a second region of the substrate, the second electrical component is configured to emit electromagnetic waves, and the first EMI shield forms the first conductive envelopment around the first electrical component and at least a portion of the second electrical component.

In some embodiments, the first EMI shield comprises a resin, and wherein an underside of the first EMI shield comprises a metal layer that forms the first conductive envelopment.

In some embodiments, the first EMI shield comprises a protrusion that extends towards the second electrical component and is positioned above the portion of the second electrical component, and wherein the protrusion extends the first conductive envelopment around the portion of the second electrical component.

In accordance with some embodiments of the present disclosure, an example method is provided. The example method comprises:
coupling a plurality of electrical components to a substrate, wherein the plurality of electrical components comprises a first electrical component coupled to a first region of the substrate and at least one other electrical component coupled to at least one other region of the substrate, and wherein the first electrical component is configured to emit electromagnetic waves;
coupling a first electromagnetic interference (EMI) shield to the substrate, wherein the first EMI shield forms a first conductive envelopment around at least the first region, wherein the first electrical component is inside the first conductive envelopment and the at least one other electrical component is outside of the first conductive envelopment, and wherein the first EMI shield comprises a first aperture positioned above the first electrical component;
coupling a lens to the first EMI shield, wherein the lens is positioned above the first electrical component, and wherein the lens is substantially aligned with the first aperture; and
coupling a cover to the substrate, wherein the cover forms an enclosure around the first region and the at least one other region of the substrate, wherein the first EMI shield is inside the enclosure, and wherein the cover comprises at least a second aperture that is substantially aligned with the lens.

In some embodiments, the method comprises grounding the first EMI shield onto the substrate via at least one conductive connection, wherein the at least one conductive connection comprises a conductive adhesive or solder.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below.

BRIEF SUMMARY OF THE DRAWINGS

Figure 1:
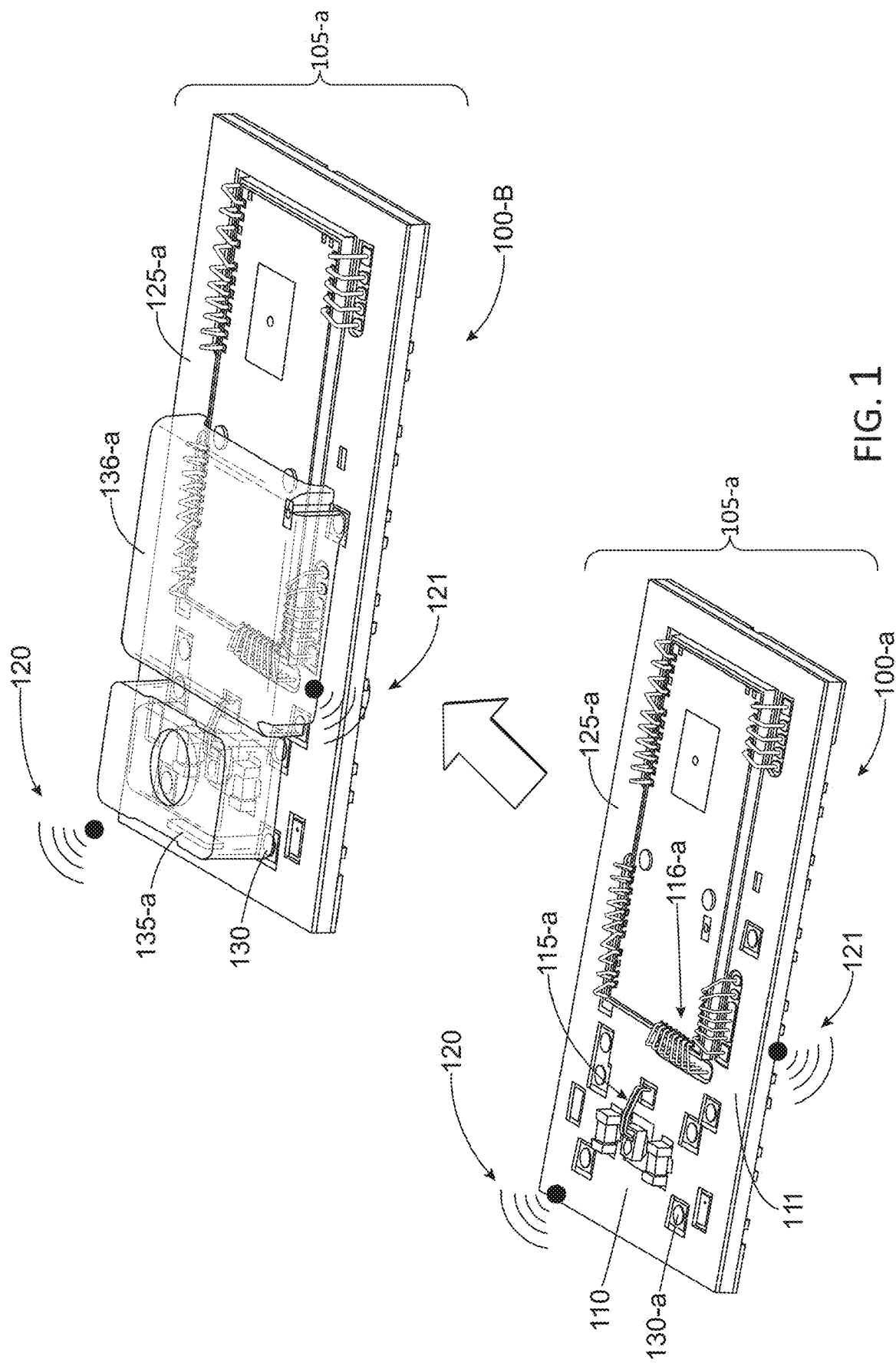
Figure 3:
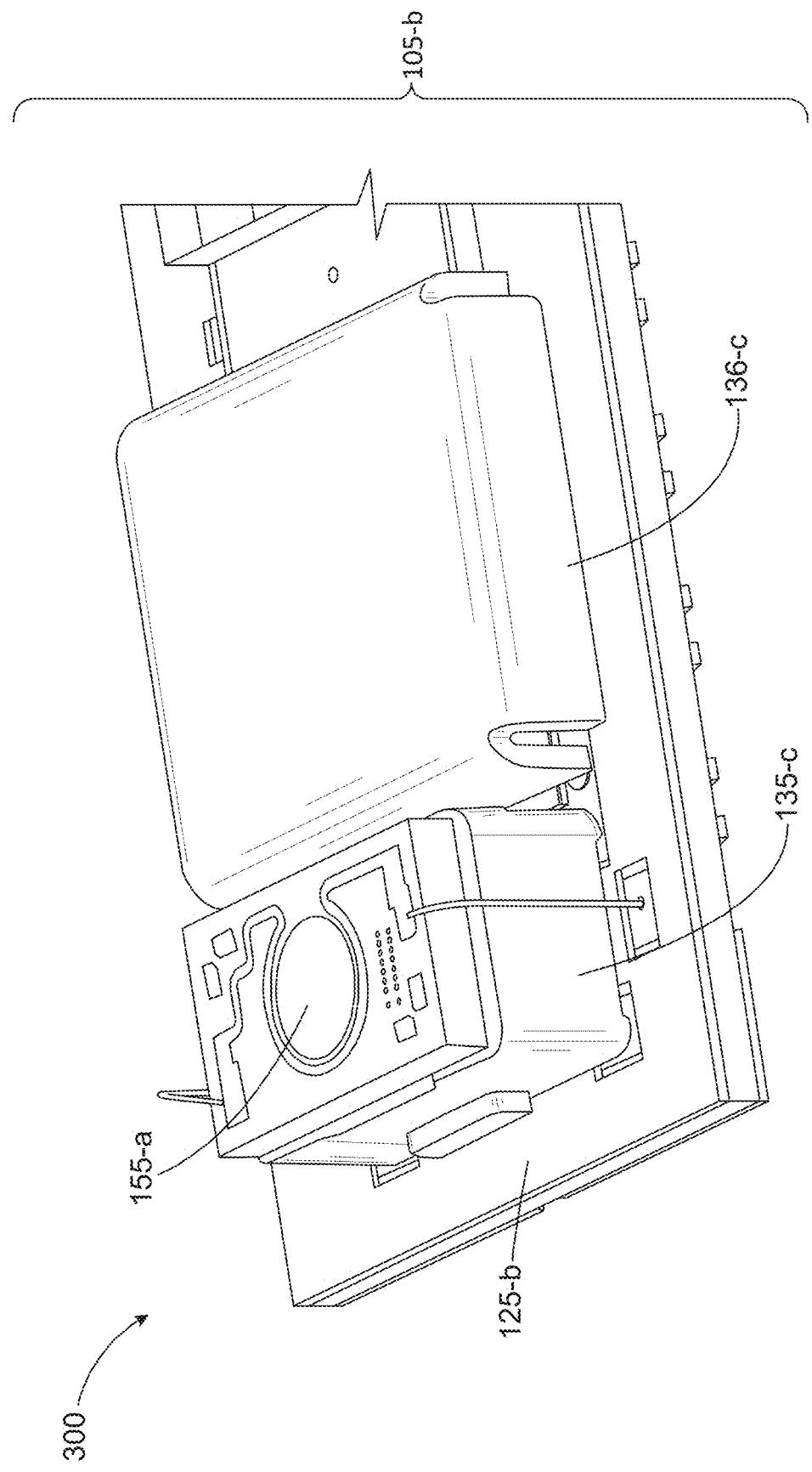
Figure 4:
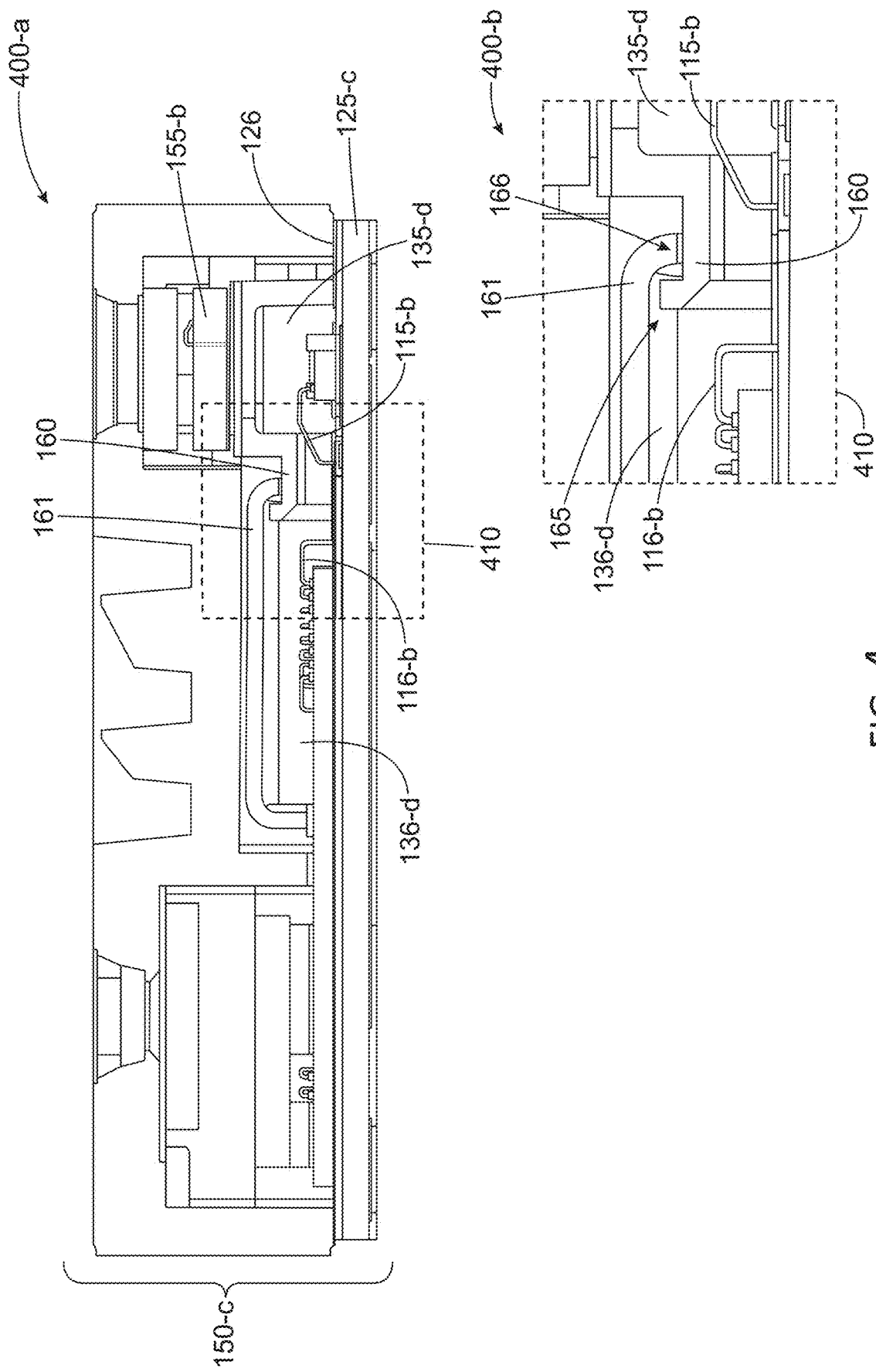
Figure 5:
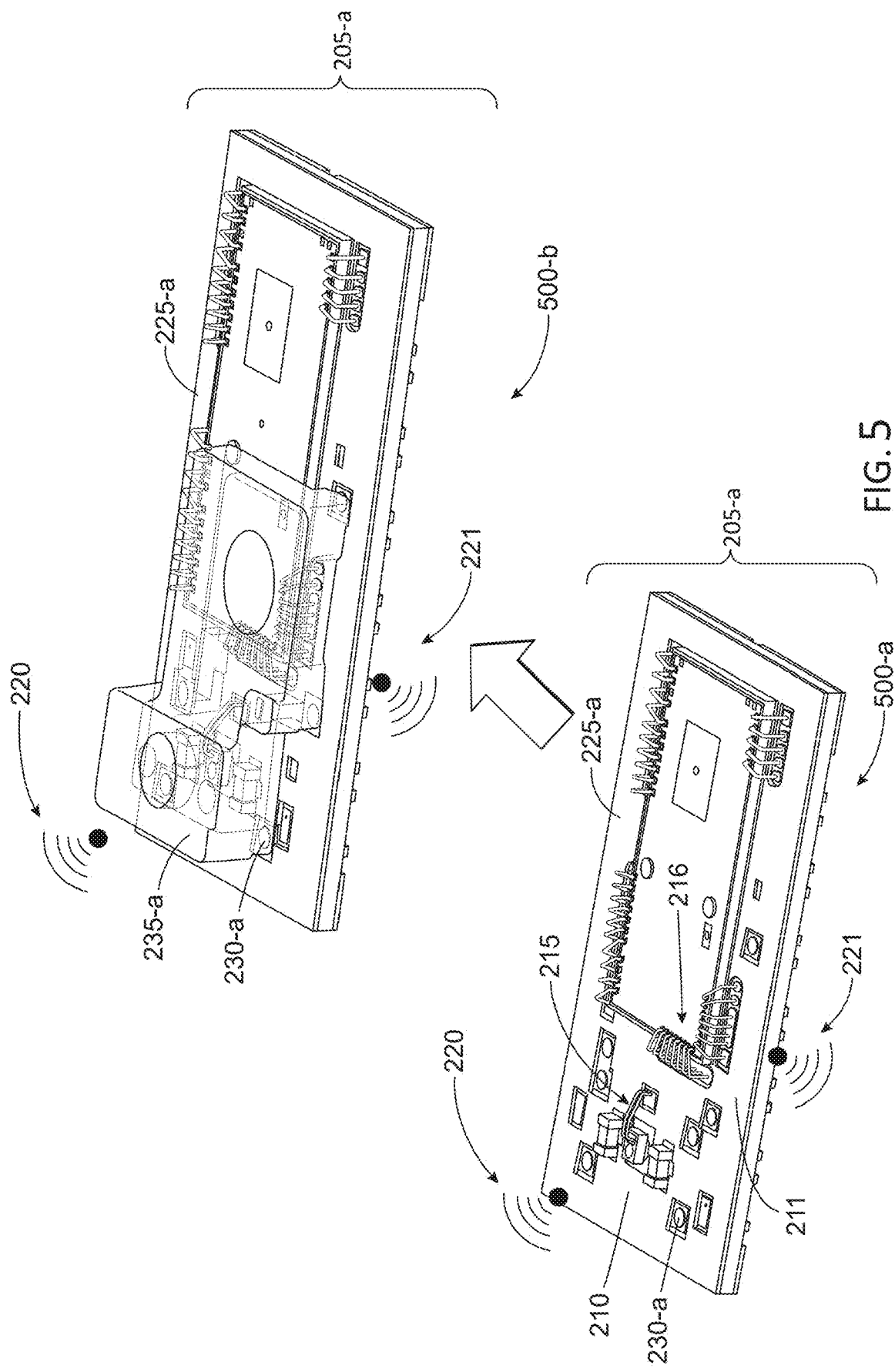
Figure 6A:
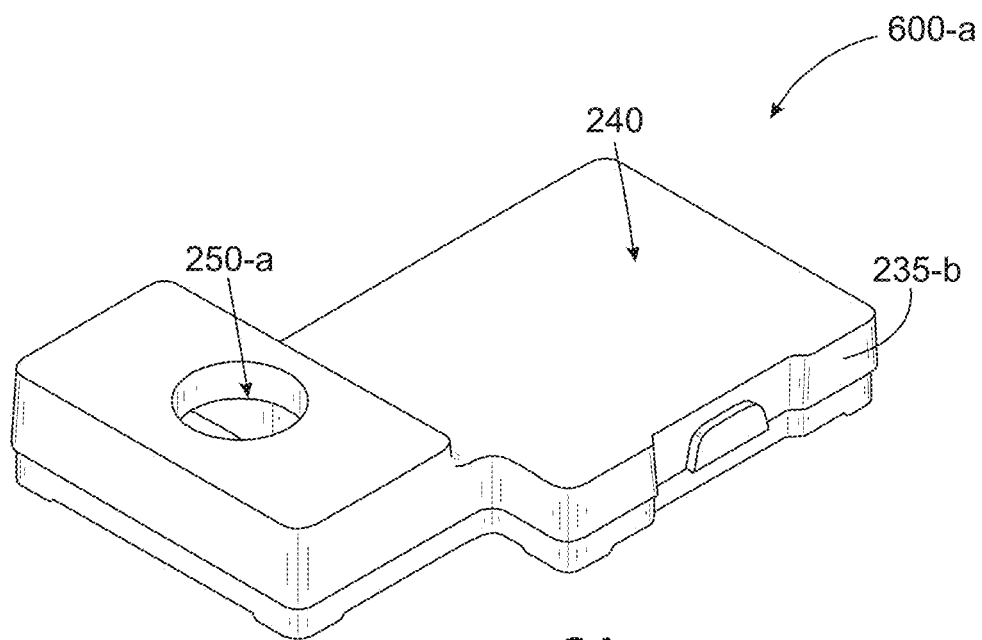
Figure 6B:
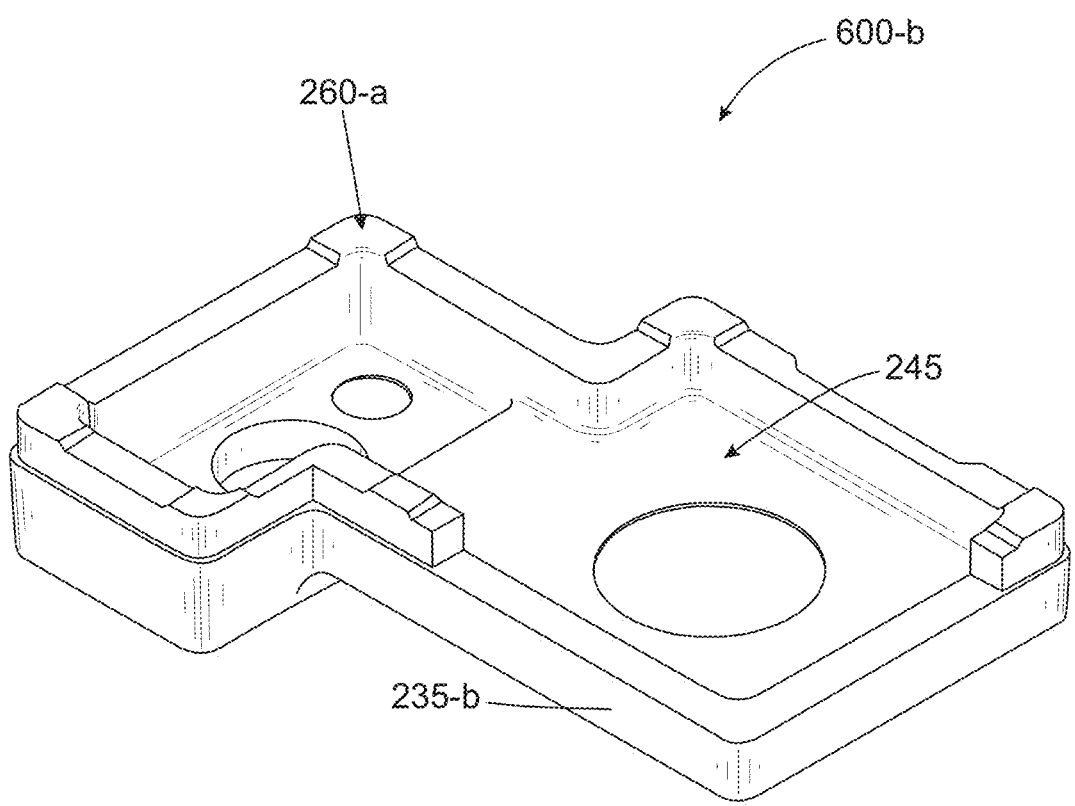
Figure 7:
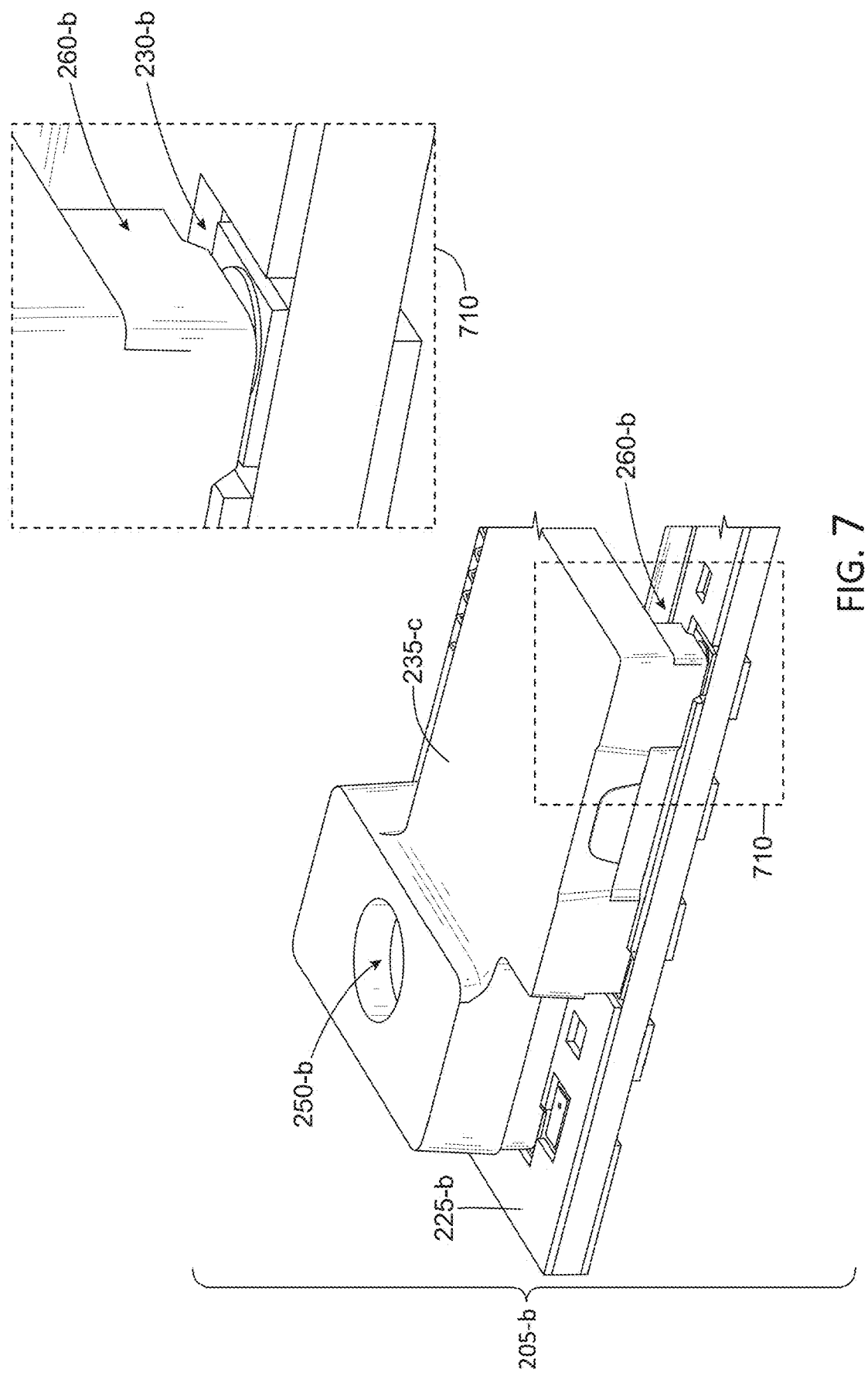
Figure 8:
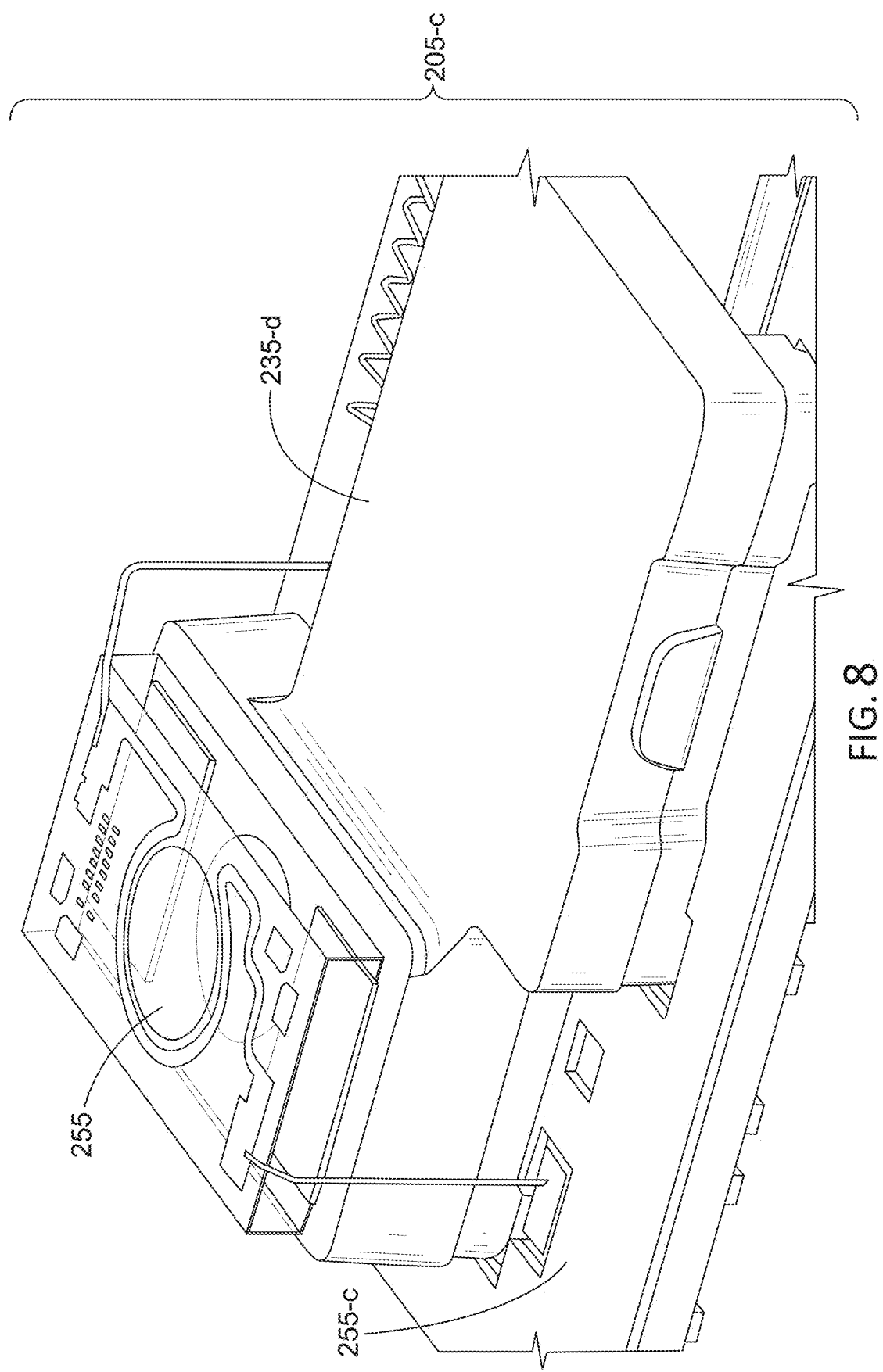
Figure 9:
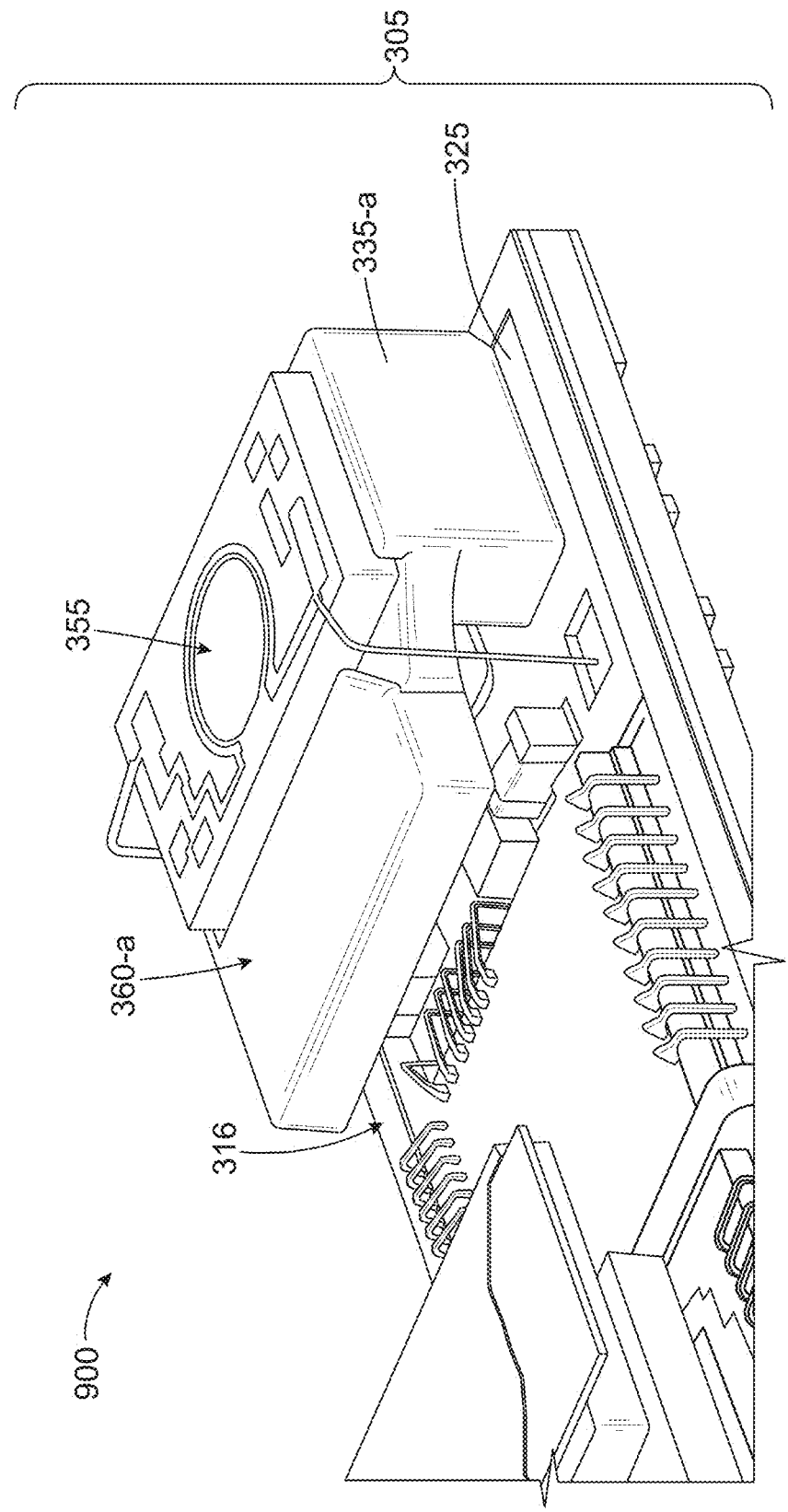
Figure 10A:
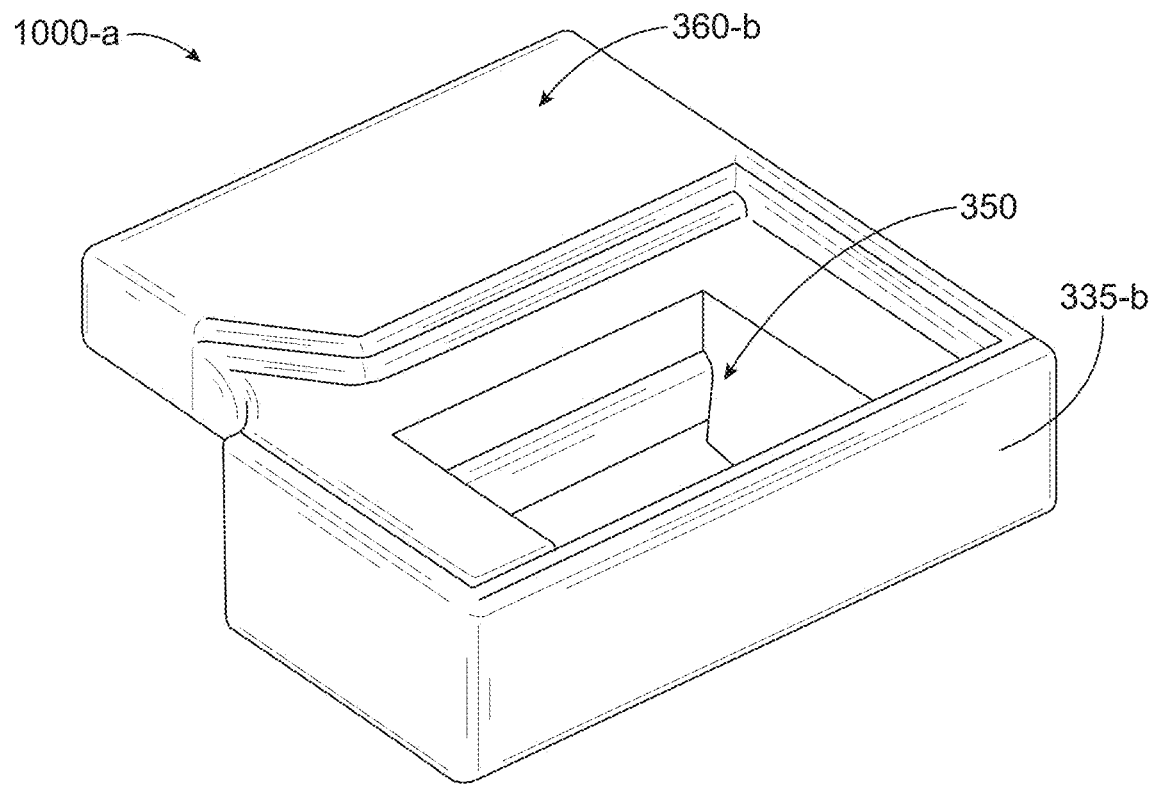
Figure 10B:
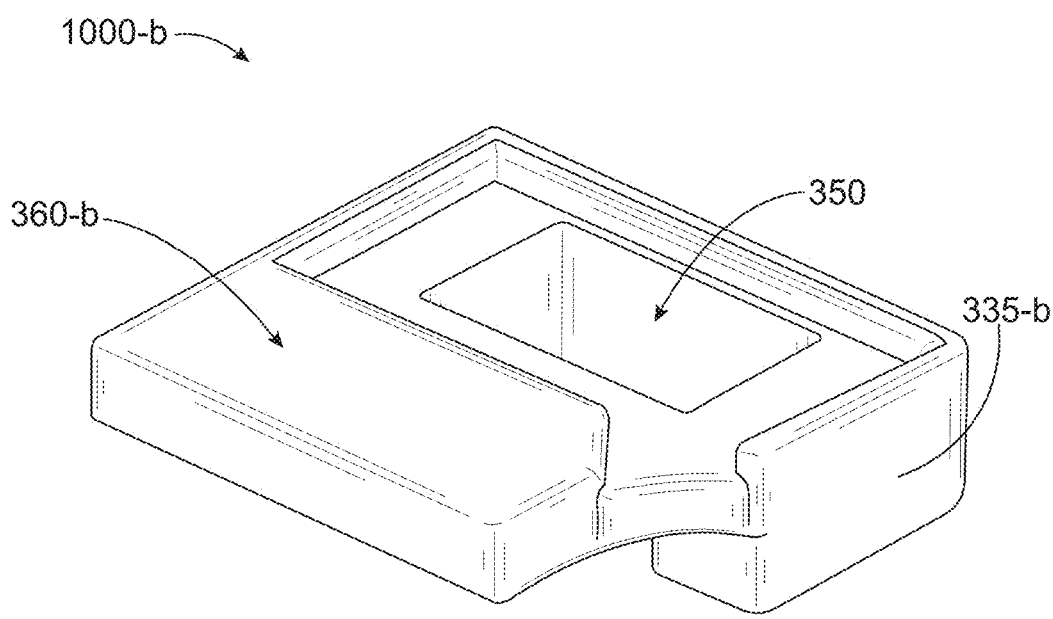
Figure 11:
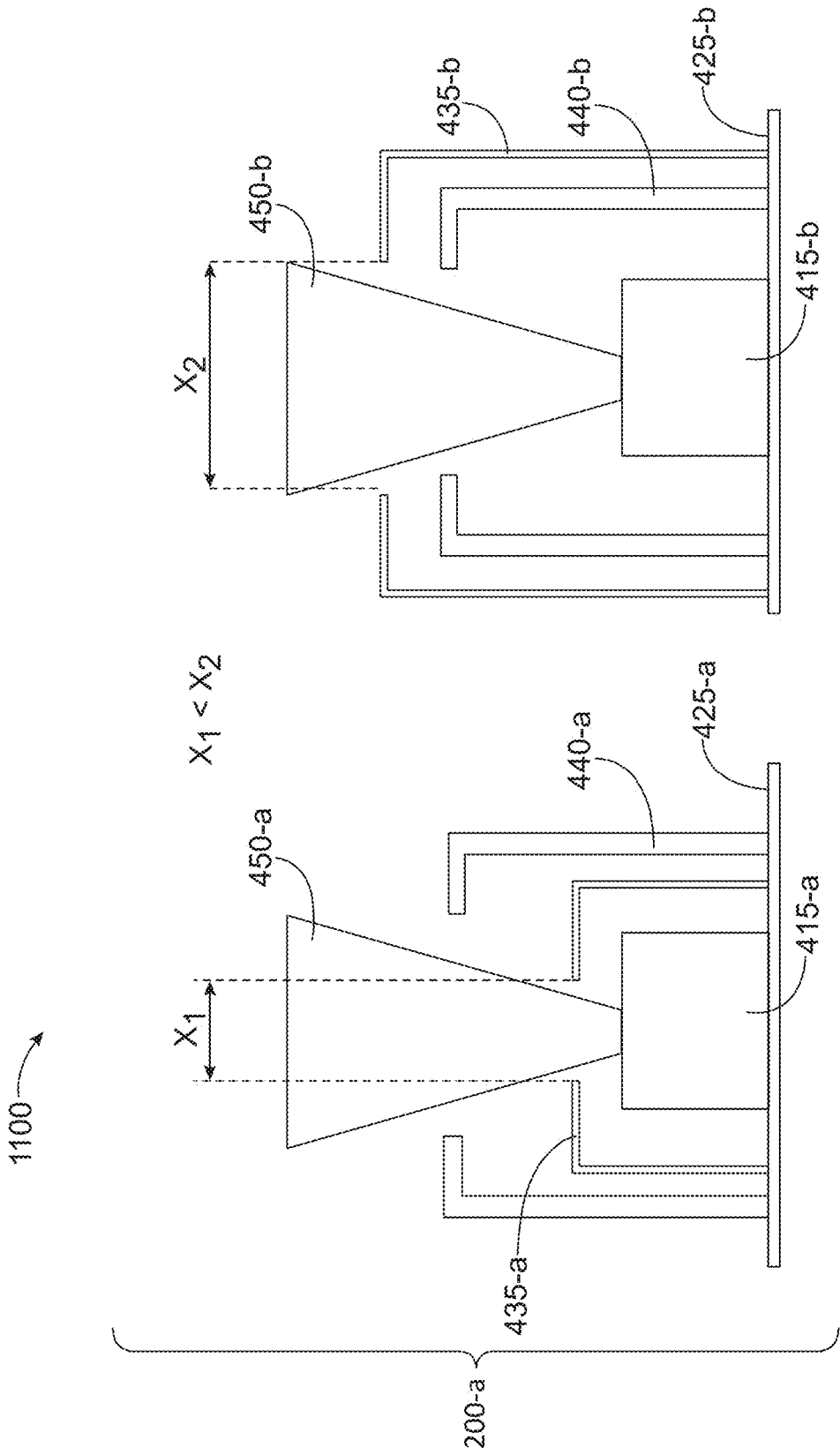
Figure 12:
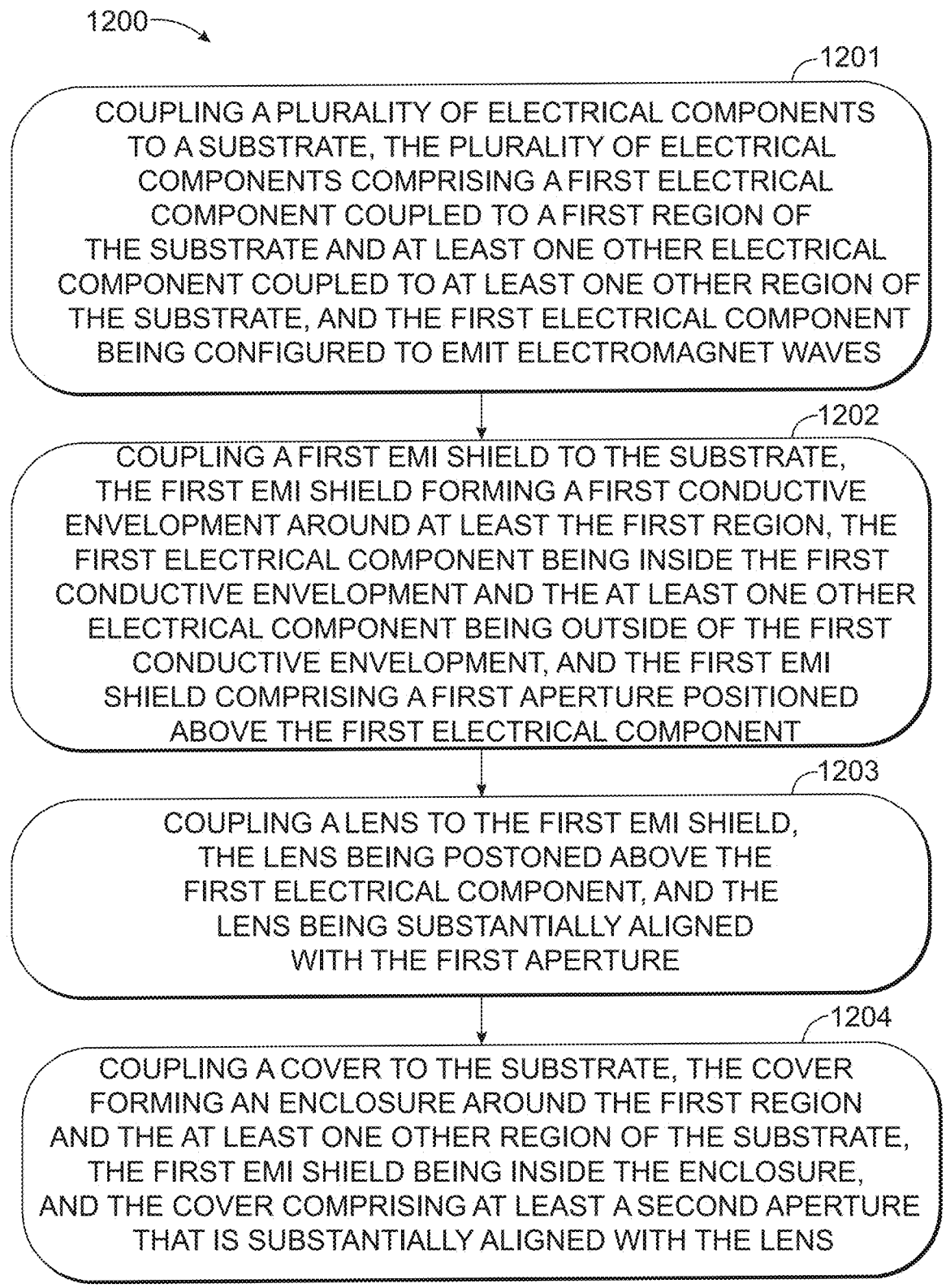

Having thus described some example embodiments of the present disclosure in general terms, reference will now be made to the accompanying drawings, which are not necessarily drawn to scale, and wherein:

FIG. 1 illustrates exemplary diagrams of an optical sensor in accordance with one or more embodiments of the present disclosure;

FIGS. 2A and 2B illustrate exemplary perspective views of EMI shields in accordance with one or more embodiments of the present disclosure;

FIG. 3 illustrates an exemplary diagram of an optical sensor in accordance with one or more embodiments of the present disclosure;

FIG. 4 illustrates exemplary diagrams an optical sensor in accordance with one or more embodiments of the present disclosure;

FIG. 5 illustrates exemplary diagrams of an optical sensor in accordance with one or more embodiments of the present disclosure;

FIGS. 6A and 6B illustrate exemplary perspective views of an EMI shield in accordance with one or more embodiments of the present disclosure;

FIG. 7 illustrates exemplary diagrams of an optical sensor in accordance with one or more embodiments of the present disclosure;

FIG. 8 illustrates an exemplary diagram of an optical sensor in accordance with one or more embodiments of the present disclosure;

FIG. 9 illustrates an exemplary diagram of an optical sensor in accordance with one or more embodiments of the present disclosure;

FIGS. 10A and 10B illustrate exemplary perspective views of an EMI shield in accordance with one or more embodiments of the present disclosure; and FIG. 11 illustrates an exemplary diagram of optical sensors in accordance with one or more embodiments of the present disclosure; and FIG. 12 illustrates an exemplary flowchart of operations for EMI shielding in an optical sensor in accordance with one or more embodiments of the present disclosure.

DETAILED DESCRIPTION

Some embodiments of the present disclosure will now be described more fully herein with reference to the accompanying drawings, in which some, but not all, embodiments of the disclosure are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in various embodiments," "in one embodiment," "according to one embodiment," "in some embodiments," and the like generally mean that the particular feature, structure, or characteristic following the phrase may be included in at least one embodiment of the present disclosure and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments or it may be excluded.

The use of the term "circuitry" as used herein with respect to components of a system or an apparatus should be understood to include particular hardware configured to perform the functions associated with the particular circuitry as described herein. The term "circuitry" should be understood broadly to include hardware and, in some embodiments, software for configuring the hardware. For example, in some embodiments, "circuitry" may include processing circuitry, communications circuitry, input/output circuitry, and the like. In some embodiments, other elements may provide or supplement the functionality of particular circuitry.

Overview

Various embodiments of the present disclosure are directed to improved EMI shielding.

A device, such as an optical sensor, may include electrical components that radiate electromagnetic (EM) waves. In some cases, such electrical components may be susceptible to electromagnetic interference (EMI), in which EM waves radiated from an electrical component (e.g., in the device or a source outside of the device) may interfere with EM waves radiated from another electrical component (e.g., in the device or a source outside of the device). EMI may be exacerbated with relatively complex and high power devices. For example, some device may include electrical components that draw relatively high currents and/or operate at relatively high data rates to improve performance, which may lead to EM waves being emitted at relatively high frequencies (e.g., mobile phones configured to operate within a 5G system may operate at relatively high frequencies, such as 5 GHZ). Consequently, in some cases, such devices may experience increased EMI. For instance, an optical sensor may include relatively high powered emitters (e.g., high power VCSELs (vertical-$c$ avity surface-emitting laser)) and/or relatively high resolution optical sensors, which may lead to transmission of radiated EM waves either out of or into the optical sensor, thereby increasing a likelihood of EMI.

EMI shielding may be used to reduce EMI. In some cases, EMI shielding in a device, such as an optical sensor, may include the use of a metal shield (also referred to herein as a metal can) to envelop a host circuit board on which one or more electrical components (e.g., an optical sensor) may be mounted. The metal shield may create a conductive envelopment around the host circuit board including the electrical components. The conductive envelopment creates a Faraday cage effect, which attenuates EM waves emitted from the host circuit board (e.g., from one or more electrical components mounted on the host circuit board). In some cases, the Faraday cage effect caused by an EMI shield prevents transmission of the EM waves to the external environment and/or prevents transmission of EM wave from external sources (e.g., EM wave emitters outside of the enveloped host circuitry board) into the host circuit board. In other words, the EMI shield may shield internal electrical components (e.g., the optical sensor) from externally radiated EM waves and/or may shield external systems from internally radiated EM waves.

In some cases, however, conventional EMI shields for EMI shielding in a device may be associated with increased component and assembly costs, as well as increased weight and volume of the device. For instance, a device may include a single metal shield, which may be used to envelop (e.g., fully envelop) a host circuit board on which one or more electrical components of the device are mounted. In some cases, however, the metal shield may be fabricated using metal stamping and, as such, may not be formed with right angle corners. That is, metal shields fabricated using metal stamping may include corners with a radius (e.g., a minimum radius), which may lead to an increase in the footprint and volume of the host circuit board (and thus the resultant device). In other words, owing to constraints in the fabrication method of stamping/forming of a metal can, the metal can may not be formed with right angle corners. Consequently, to envelope the entirety of the host circuit board, the metal can may be formed with a relatively large footprint, which may result in an increased circuit board footprint and circuit board volume. Moreover, the use of a non-grounded metal shield may lead to cross-talk between the electrical components mounted on the host circuit board (e.g., electrical components within the envelopment of the metal shield). That is, a non-grounded EMI shield may lead to internal cross-talk of radiated EM waves, for example, due to EM waves emitted from an electrical component reflecting off the conductive envelopment and interfering with other components within the metal can EMI shield. In some cases, however, the inclusion of ground pins to ground the metal shield (e.g., a metal shield formed from stamping) may lead to further increases in the footprint of the host circuit board.

In some cases, the footprint of a host circuit board may be reduced by using multiple metal shields. That is, in some cases (e.g., when shielding at the circuit board level), multiple external metal cans may be used compensate for manufacturing constraints, as well as spatial constraints of the host circuit board and systems. For instance, a device may include a metal can to shield a lens barrel and another metal can to shield an optical sensor. In other words, multiple (e.g., separate) metal cans may be used in devices to shield different electrical components, such as one or more lens barrels and an optical sensor (e.g., in the case of a camera module). In some cases, however, openings between metal cans (e.g., adjacent metal cans) may introduce gaps through which EM waves (e.g., relatively high frequency EM waves) may leak. Accordingly, EMI shields formed with multiple metal cans may experience reduced EMI shielding performance (e.g., which may be exacerbated for EMI due to higher frequency EM waves). In other words, openings between multiple metal cans introduces gaps through which higher frequency EM waves may leak, thereby rendering the EMI shielding less effective, for example, when shielding against higher frequency waves.

In some cases, the footprint of the circuit board may be reduced by incorporating an EMI shield into packaging of the device. In other words, for scenarios in which circuit board level EMI metal shielding cannot be used in a device due to system footprint constraints and/or a metal shield provides insufficient EMI shielding for higher frequencies EM waves, EMI shielding may be incorporated into the packaging of the device. For instance, the packaging of a device may be formed out of resins with conductive fillers. In some cases, however, conductive fillers lead to increased cost and/or relatively thin packaging walls with reduced EMI shielding performance. That is, in some cases, the incorporation of EMI shielding into the packaging of a device, such as an optical sensor, may include using a resin compounded with conductive fillers to mold the packaging of the device. In such cases, however, the use of resins compounded with conductive fillers leads to increases in material costs of the packaging (e.g., due to relatively high costs of conductive fillers). Additionally, for relatively small devices in which the packing includes thin walls, the thin walls of the packaging may result in a constrained flow of the conductive resins in portions of the packaging (e.g., due to regions on the packaging having a lower concentration of conductive fillers than other regions), which may result in reduced shielding effectiveness in the portions of the packaging. Moreover, compounded resins may be associated with a relatively low conductivity (e.g., relative to metal) may lead to constrained EMI shielding effectiveness.

In some cases, an underside (e.g., inner surface) of packaging of a device may be lined with a layer of an EMI absorber film or foam. However, such EMI absorber films or foams may not be suitable for packaging with relatively complex outlines and thin layering (e.g., due to spatial constrains) may lead to reduced EMI shielding performance. That is, in some cases, the incorporation of EMI shielding into the packaging of a device, such as an optical sensor, may include using EMI absorber films or EMI absorber foam to envelop the inner surfaces of the packaging of the device. In such cases, however, EMI absorber films or EMI absorber foams may not cover the entirety of the inner surfaces of the packaging, for example, due to complex packaging outlines. Additionally, in some cases, EMI absorber films or EMI absorber foams may be applied in a thin layer owing to space constraints in smaller devices and, as such, may have constrained shielding effectiveness. In some cases, EMI absorber films or EMI absorber foams may be applied externally (e.g., on the outer surface of the packaging), which may lead to an increased in the volume of the packaging. Moreover, in some cases, adhesion to the outer surface of the packaging may be relatively weak, and under reflow, a survivability of the adhesion and/or absorber layer may be reduced (e.g., the survivability of the adhesion and/or absorber layer under reflow may be low).

The present disclosure is generally directed to improved EMI shields. The present disclosure includes, among other things, improved methods for EMI shielding in which the EMI shielding is introduced within device packaging (e.g., within the packaging of an optical sensor) and is applied directly to one or more electrical components or regions on the device substrate. The present disclosure provides for, among other things, improved EMI shielding in optical sensors with one or more apertures, which provide for the passage of optical beams (e.g., for sensing purpose).

Various embodiments of the present disclosure use EMI shields to provide conductive envelopments around one or more electrical components or regions of a substrate within a device (e.g., a sensor module). For example, a device, such as an optical sensor, may include one or more EM wave emitting components, such as a laser diode (e.g., VCSEL component) and a current source associated with the laser diode (e.g., a VCSEL driver and power traces or wire bonds connecting the VCSEL driver to the VCSEL component). In some embodiments, one or more EMI shields may be used to form a conductive envelopment around the one or more emitting components (e.g., the VCSEL driver, the VCSEL, wire traces associated with the VCSEL driver and/or VCSEL).

For example, in some embodiments, multiple (e.g., two) shielding elements may be used to form multiple conductive envelopments around multiple EM wave emitting sources (e.g., multiple electrical components configured to emit EM waves). In some such embodiments, the multiple shielding elements (e.g., EMI shields) may be constructed out of metal. The multiple shielding elements may be coupled to (e.g., mounted on) a substrate within the device and above a respective EM wave emitting source to provide a localized conductive envelopment (i.e., an EMI shield) over the respective EM wave emitting source. In some examples, a first shielding element of the multiple shielding elements may include a first protrusion (e.g., a flange element). The first protrusion may be positioned under a second protrusion (e.g., overhang element) included in a second shielding element of the multiple shielding elements, which may create a relatively complex path for emitted EM waves and, as such, may reduce the likelihood of the emitted EM waves exiting the device and/or interfering with one or more other components within the device.

Additionally, or alternatively, in some embodiments, a single shielding element may be used to form a conductive envelopment around multiple EM wave emitting sources (e.g., multiple electrical components configured to emit EM waves). For example, in some embodiments, the single shielding element may be molded with plastic and/or resin and a conductive metal layer may be plated on the underside of the shielding element to provide a localized conductive envelopment (e.g., localized EMI shielding) around the EM wave emitting sources. In some examples, the conductive metal layer may include a metal (e.g., any metal) that conducts electrically and is able to perform EMI shielding. The conductive metal layer may include one or more metals selected based on electrical conductivity. For example, the conductive metal may include one or more metals with a relatively high electrical conductivity (e.g., due to such metals having improved performance relative to other metals with relatively low electrical conductivity). Additionally, or alternatively, the conductive metal layer may include one or more metals selected based on cost, availability, and/or environmental factors. For example, the conductive metal layer may include one or more metals with a relatively low cost, one or more metals that are readily available, and/or one or more metals having a relatively low environmental impact. Non-limiting examples of metals that may be used for the conductive layer include beryllium, copper, brass, steel, stainless steel, nickel, and silver.

The conductive metal layer may be relatively thick (e.g., may have a thickness of about 1 micron to about 12 microns), which may lead to increased performance of the EMI shielding. In some examples, the shielding element may be placed onto the substrate of the device and the use of plastics or resins to form the shielding element may reduce the likelihood of shorting other conductive elements on the substrate. In some other embodiments, the single shielding element may be formed from metal and include a protrusion (e.g., an overhang). The single shielding element may be mounted over a first EM wave emitting source and the protrusion may extend over a second EM wave emitting source to provide a localized conductive envelopment (e.g., localized EMI shielding) with reduced manufacturing costs.

In some embodiments, an EMI shield may include one or more apertures (e.g., one or more openings on a top side of the EMI shield may be catered). The one or more apertures may enable one or more functionalities of a device. For example, the one or more apertures may enable optical beams to pass through the EMI shield, for example, to support one or more optical sensing functionalities of an optical sensor. In some examples, the device (e.g., an optical sensor) may include a lens, which may be mounted at a distance from an EM wave emitting component of the device (e.g., a light emitting source, such as a laser diode). In some such examples, an EMI shield may serve as a mounting structure for the lens. For example, an optical sensor may include a lens for focuses or disperses EM waves (e.g., by means of refraction) emitted from an electrical component of the optical sensor. Accordingly, to facilitate focusing or dispersion of the EM waves by the lens, the lens may be mounted at a distance (e.g., a focal distance) from the electrical component. In some conventional systems, the lens may be mounted on a spacer (e.g., a silicon spacer) with a height that is based on the distance. In some cases, however, the use of spacers may lead to increased manufacturing costs and reduced space efficiency (e.g., may reduce a quantity of usable space within the device). To reduce assembly costs and improved space efficiency, the present disclosure provides for using EMI shields as spacers (e.g., Z height spacers) between a lens and an associated EM wave emitting component. That is, in accordance with some embodiments, a lens associated with an electrical component may be coupled to (e.g., mounted on) an EMI shield that forms a conductive envelopment around the electrical component (e.g., the EMI shield may replace conventional Z height spacers used for mounting lenses). In some examples, using EMI shields to provide conductive envelopments around one or more electrical components or regions of a substrate may lead to improved EMI shielding performance, as well as reduced material and assembly costs.

Exemplary Apparatuses, Systems, and Methods

Embodiments of the present disclosure include systems, apparatuses, and methods for improved EMI shielding.

FIG. 1 illustrates exemplary diagrams 100 (e.g., a diagram 100-*a*, a diagram 100-*b*) of an optical sensor 105-*a* in accordance with one or more embodiments of the present disclosure.

As depicted in the diagram 100-*a*, the optical sensor 105-*a* includes a substrate 125-*a* and multiple electrical components coupled to the substrate 125-*a*. In some examples, the substrate 125-*a* includes a printed circuit board (PCB). The electrical components may be coupled to (e.g., mounted on) the substrate 125-*a* via one or multiple techniques. In some examples, one or more electrical components may be mounted onto a surface (e.g., a top surface) of the substrate 125-*a* via a conductive connection, such as via leads (e.g., inserted through pre-drilled holes), wire bonds, solder, conductive adhesive, and/or some combination thereof. For example, as depicted in FIG. 1, the optical sensor 105-*a* may include one or more first electrical components coupled to a first region 110 of the substrate 125-*a* and one or more second electrical components coupled to a second region 111. As described herein, an electrical component refers to hardware that provides one or more functionalities for an electronic system or otherwise supports one or more functionalities of the electronic system and/or another electrical component within the electronic system. In some examples, the optical sensor 105 (e.g., an electronic system) may include multiple electrical components, such as a laser diode and a current source for the laser diode (e.g., a driver).

An electrical component may include one or more subcomponents that collectively contribute to the one or more functionalities for the electric system and/or another electrical component within the electronic system. For example, as depicted in diagram 100-*a*, the laser diode (e.g., a VCSEL) may be coupled to the first region 110 of the substrate 125-*a* and the current source for the laser diode may be coupled to the second region 111 of the substrate 125-*a*. In other words, the first region 110 may correspond to a location of a laser diode (e.g., a VCSEL and one or more VCSEL connect wire bonds) and the second region 111 may correspond to a location of current source for the laser diode (e.g., a VCSEL driver and one or more VCSEL driver connect wire bonds). Accordingly, the first region 110 may include a first electrical component 115-*a* (e.g., wire bonds for the laser diode, a subcomponent of the laser diode) and the second region 111 may include a second electrical component 116-*a* (e.g., wire bonds for the driver, a subcomponent of the driver). In some examples, an electronic system may include one or more electrical components that emit EM waves (e.g., EM radiation sources). For example, in some embodiments, the first electrical component 115-*a* and the second electrical component 116-*a* may be configured to emit EM waves. In other words, the first electrical component 115-*a* and the second electrical component 116-*a* (e.g., respective wire bonds for the laser diode and associated laser driver) may be EM wave emitting sources. As depicted, the first electrical component 115-*a* may emit first EM waves 120 and the second electrical component 116-*a* may emit second EM waves 121.

In some embodiments, as depicted in diagram 100-*b*, multiple EMI shields may be used to provide localized EMI shielding for multiple EM wave emitting sources (e.g., multiple sources of EM radiation, such as the first electrical component 115-*a* and the second electrical component 116-*a*) within the electronic system (e.g., the optical sensor 105-*a*). In at least one example embodiment, two EMI shields (e.g., two separate shielding elements, a first EMI shield 135-*a* and a second EMI shield 136-*a*) may be used to provide localized EMI shielding for a respective one or more EM wave emitting sources (e.g., the first electrical component 115-*a* and the second electrical component 116-*a*) within two regions (e.g., two separate regions, the first region 110 and the second region 111) of the substrate 125-*a*. For example, the first EMI shield 135-*a* may be coupled to the first region 110 and the second EMI shield 136-*a* may be coupled to the second region 111. In some examples, the first EMI shield 135-*a* and the second EMI shield 136-*a* may be coupled to the substrate 125-*a* via one or more conductive connections (e.g., to one or more grounding pads, such as a grounding pad 130-*a*). For example, the first EMI shield 135-*a* and the second EMI shield 136-*a* may be coupled to the substrate 125-*a* via one or more conductive connections, such that the first EMI shield 135-*a* and the second EMI shield 136-*a* may be grounded to the substrate 125-*a* (e.g., for grounding). In some examples, the first EMI shield 135-*a* and the second EMI shield 136-*a* may be coupled to the substrate 125-*a* via a conductive adhesive and/or solder.

The first EMI shield 135-*a* and the second EMI shield 136-*a* may include a conductive material. That is, the first EMI shield 135-*a* and the second EMI shield 136-*a* may be formed from a conductive material. For example, the EMI shield 135-*a* (e.g., a VCSEL shield) may include metal (e.g., may be formed from metal) and the EMI shield 136-*a* (e.g., a VCSEL driver shield) may include a metallic sheet (e.g., may be formed from a metallic sheet). Accordingly, the first EMI shield 135-*a* and the second EMI shield 136-*a* (e.g., the EMI shielding elements) may provide conductive envelopments. That is, a shielding element (e.g., the first EMI shield 135-*a*, and the second EMI shield 136-*a*), when installed on the substrate 125-*a* (e.g., within a module that includes the optical sensor 105-*a*) above one or more EM wave emitting sources (e.g., the first electrical component 115-*a*, the second electrical component 116-*a*), provides a conductive envelopment over the one or more EM wave emitting sources, thereby shielding EM waves emitted from the one or more EM wave emitting sources (e.g., any emitted EM waves) from exiting the module and/or affecting one or more other components withing the module. That is, a localized conductive envelopment provided by an EMI shield may reduce a likelihood of EM waves from an electrical component within an electronic system (e.g., an EM wave emitting source) from affecting one or more other electrical components within the electronic system and/or one or more electrical components outside of the electronic system.

For example, the EMI shield 135-*a*, which may be coupled to the first region 110 and, accordingly, may provide a conductive envelopment around one or more electrical components within the first region 110 (e.g., one or more electrical components coupled to the first region 110 of the substrate 125-*a*), including, but not limited to, the first electrical component 115-*a*. Accordingly, in some examples, the first EMI shield 135-*a* may attenuate the first EM waves 120 (e.g., via a Faraday cage effect in which an external electrical field of the first EM waves 120 cause electric charges within the conductive material of the first EMI shield 135-*a* to be distributed in a manner that cancels out the electrical field's effect inside the Faraday cage), such that a likelihood of the first EM waves 120 affecting one or more other electrical components may be reduced. In other words, the first EMI shield 135-*a* may substantially isolate the first EM waves 120-*a* (which are emitted from the first electrical component 115-*a*) from the second electrical component 116-*a* and/or one or more electrical components within the optical sensor 105-*a*. That is, the first EMI shield 135-*a* may isolate the first EM waves 120-*a* such that the first EM waves 120-*a* are unlikely to cause EMI. Additionally, the second EMI shield 136-*a*, which may be coupled to the second region 111, may provide a conductive envelopment around one or more electrical components within the second region 111 (e.g., one or more electrical components coupled to the second region 111 of the substrate 125-*a*), including, but not limited to, the electrical component 116-*a*. Accordingly, in some examples, the second EMI shield 136-*a* may attenuate the second EM waves 121 (e.g., via a Faraday cage effect in which an external electrical field of the second EM waves 121 cause electric charges within the conductive material of the second EMI shield 136-*a* to be distributed in a manner that cancels out the electrical field's effect inside the Faraday cage), such that a likelihood of the second EM waves 121 affecting one or more other electrical components may be reduced. In other words, the second EMI shield 136-*a* may substantially isolate the second EM waves 121 (which are emitted from the second electrical component 116-*a*) from the first electrical component 115-*a* and/or one or more electrical components within the optical sensor 105-*a*.

FIGS. 2A and 2B illustrate perspective views 200 (e.g., a perspective view 200-*a*, a perspective view 200-*b*, a perspective view 200-*c*, and a perspective view 200-*d*) of a first EMI shield 135-*a* and a second EMI shield 136-*b* in accordance with one or more embodiments of the present disclosure. The first EMI shield 135-*b* and the second EMI shield 136-*b* may be examples of the first EMI shield 135-*a* and the second EMI shield 136-*a*, respectively, illustrated by and described with reference to FIG. 1.

As depicted in the perspective view 200-*a*, the first EMI shield 135-*b* includes a first surface 140-*a* (e.g., a top surface). Additionally, as shown in the perspective view 200-*a*, the first EMI shield 135-*b* includes an aperture 150. In some examples, the aperture 150 enables one or more functionalities associated with an electrical component, such as a laser diode (e.g., above which the first EMI shield 135-*b* may be mounted). For example, the first EMI shield 135-*b* may include an opening (e.g., the aperture 150) above the laser diode (e.g., VCSEL) to facilitate one or more functionalities of the laser diode. In some examples, the aperture 150 may enable light generated by the laser to pass through the first EMI shield 135-*b*, such that an optical sensor may use the light to perform one or more functionalities (e.g., perform optical sensing). As depicted in the perspective view 200-*b*, the first EMI shield 135-*b* includes a second surface 145-*a* (e.g., a bottom surface, an underside). In some embodiments, as depicted in the perspective view 200-*c*, the EMI shield 136-*b* includes a first surface 140-*b* (e.g., a top surface). Additionally, as depicted in the perspective view 200-*d*, the EMI shield 136-*b* includes a second surface 145-*b* (e.g., a bottom surface, an underside).

The first EMI shield 135-*b* and the second EMI shield 136-*b* may be formed using one or more fabrication techniques. In some examples, the first EMI shield 135-*b* and the second EMI shield 136-*b* may be included in a relatively small optical sensor (e.g., the optical sensor 105-*a* illustrated by and described with reference to FIG. 1, which may be included on one or more devices, such as a mobile phone), which may include relatively small electrical components. In some such examples, due to the relatively small size of the optical sensor (e.g., the optical module), and one or more electrical components for which the first EMI shield 135-*b* and the second EMI shield 136-*b* may provide shielding, micro fabrication techniques may be used for fabrication of the first EMI shield 135-*b* and the second EMI shield 136-*b*. Some such microfabrication techniques include micro subtractive manufacturing, metal injection molding, micro stamping, or cast injection molding processes, and/or the like.

Although the foregoing description of FIG. 1, and the associated drawing, describes example embodiments in the context of certain example configurations of the first EMI shield and the second EMI shield, it should be appreciated that different configurations of the first EMI shield and the second EMI shield may be provided by alternative embodiments without departing from the scope of the appended claims. In this regard, for example, different configurations of the first EMI shield and the second EMI shield than those explicitly described above are also contemplated as may be set forth in some of the appended claims.

FIG. 3 illustrates a diagram 300 of an optical sensor 105-*b* in accordance with one or more embodiments of the present disclosure. The optical sensor 105-*b* may be an example of the optical sensor 105-*a* illustrated by and described with reference to FIG. 1.

As depicted in the diagram 300, the optical sensor 105-*b* includes a substrate 125-*b*, which may be an example of the substrate 125-*a* illustrated by and described with reference to FIG. 1. For example, in some embodiments, the optical sensor 105-*b* may include multiple electrical components coupled to the substrate 125-*a*. In some examples, the optical sensor 105-*a* may include multiple electrical components that are coupled to (e.g., mounted on) a top surface of the substrate 125-*b*, for example, via a conductive connection.

As depicted in the diagram 300, the optical sensor 105-*a* may include a first EMI shield 135-*c* and a second EMI shield 136-*c*. The first EMI shield 135-*c* may be an example of a first EMI shield illustrated by and described with reference to FIGS. 1 and 2A and the second EMI shield 136-*c* may be an example of a second EMI shield illustrated by and described with reference to FIGS. 1 and 2B. For example, the first EMI shield 135-*c* and the second EMI shield 136-*c* may provide localized EMI shielding for multiple EM wave emitting sources (e.g., multiple sources of EM radiation, such as the first electrical component 115-*a* and the second electrical component 116-*a* illustrated by and described with reference to FIG. 1). In at least one example embodiment, two EMI shields (e.g., two separate shielding elements, the first EMI shield 135-*c* and the second EMI shield 136-*c*) may be used to provide localized EMI shielding for a respective one or more electrical components configured to emit EM waves (e.g., one or more EM wave emitting sources, such as the first electrical component 115-*a* and the electrical component 116-*a* illustrated by and described with reference to FIG. 1).

In some examples, the first EMI shield 135-*c* and the second EMI shield 136-*c* may be coupled to the substrate 125-*b* via one or more conductive connections (e.g., to one or more grounding pads, such as the grounding pad 130 illustrated by and described with reference to FIG. 1). In some embodiments, as depicted in FIG. 3, a lens 155-*a* may be coupled to (e.g., mounted on) a top surface of the first EMI shield 135-*c*. In some examples, the lens 155-*a* may be substantially aligned with an aperture (e.g., the aperture 150 illustrated by and described with reference to FIG. 2), for example, to facilitate one or more functions associated with the optical sensor (e.g., a laser diode of the optical sensor, above which the first EMI shield 135-*c* may be mounted). That is, the lens 155-*a* may be aligned with the aperture such that lighted passed through the aperture may be focused or dispersed via the lens 155-*a*.

FIG. 4 illustrates exemplary diagrams 400 (e.g., a diagram 400-*a*, a diagram 400-*b*) of an optical sensor 105-*c* in accordance with one or more embodiments of the present disclosure. The optical sensor 105-*c* may be an example of an optical sensor illustrated by and described with reference to FIGS. 1 and 3.

As depicted in the diagrams 400, the optical sensor 105-*c* includes a substrate 125-*c* and multiple electrical components coupled to a top surface 126 of the substrate 125. The substrate 125-*c* may be an example of a substrate illustrated by and described with reference FIGS. 1 and 3. For example, as depicted, the optical sensor 105-*c* may include a first electrical component 115-*b* and a second electrical component 116-*b* coupled to the top surface 126 of the substrate 125. The first electrical component 115-*b* and the second electrical component 116-*b* may be examples of a first electrical component and a second electrical component illustrated by and described with reference to FIG. 1. For example, the first electrical component 115-*b* may include wire bonds for a laser diode and the second electrical component 116-*b* may include wire bonds for a laser driver.

In some embodiments, as depicted in the diagrams 400, the optical sensor 105-*c* includes a first EMI shield 135-*d* and a second EMI shield 136-*d*, which may be examples of a first EMI shield and a second EMI shield, respectively, illustrated by and described with reference to FIGS. 1, 2A, 2B, and 3. For example, the first EMI shield 135-*d* and the second EMI shield 136-*d* may be used to provide localized EMI shielding for the first electrical component 115-*b* and the second electrical component 116-*b*, respectively. In other words, the optical sensor 105-*c* may include two EMI shields (e.g., two separate metal shields). In some such embodiments, the optical sensor 105-*c* may include a lens 155-*b* coupled to (e.g., mounted on) the first EMI shield 135-*d*. The lens 155-*b* may be an example of the lens 155-*a* illustrated by and described with reference to FIG. 3. For example, the lens 155-*b* may be substantially aligned with an aperture in the first EMI shield 135-*d* to support one or more functionalities of the optical sensor 105-*c*.

In some embodiments, as depicted in the diagrams 400, the first EMI shield 135-*d* and the second EMI shield 136-*d* may be configured to reduce a likelihood of EM waves leaking out of the first EMI shield 135-*d* and the second EMI shield 136-*d*. For example, to reduce a likelihood of EM waves escaping between the first EMI shield 135-*d* and the second EMI shield 136-*d* (e.g., at the interface of the first EMI shield 135-*d* and the second EMI shield 136-*d*), the first EMI shield 135-*d* and the second EMI shield 136-*d* may be positioned adjacent to each other and in a manner that creates a complex path for EM waves. In some examples, the first EMI shield 135-*d* and the second EMI shield 136-*d* may include one or more protrusions (e.g., first EMI shield 135-*d* may include an overhang and the second EMI shield 136-*d* may include a flange), which may create the complex path for EM waves. For example, as depicted in the diagrams 400, the first EMI shield 135-*d* may include a first protrusion 160 (e.g., a flange) that extends towards the second EMI shield 136-*d*. Additionally, in some examples, the second EMI shield 136-*d* may include a second protrusion 161 that extends towards the first EMI shield 135-*d*.

In some examples, the first protrusion 160 (e.g., at least a portion of the first protrusion 160) is positioned under the second protrusion 161 (e.g., at least a portion of the second protrusion 161). As depicted in the diagram 400-*b* (which includes an enlarged diagram of a region 410 of the diagram 400-*a*), at least a first surface 165 of the first protrusion 160 may be adjacent to the second EMI shield 136-*d* and at least a second surface 166 of the second protrusion 161 may be adjacent to the first EMI shield 135-d. For example, in the region 410, which includes the interface of the first EMI shield 135-d and the second EMI shield 136-d, the first EMI shield 135-d and the second EMI shield 136-d may be provided relatively close to each other, such that a likelihood of EM waves leaking from the first EMI shield 135-d and/or the second EMI shield 136-d may be reduced. That is, the first EMI shield 135-d and the second EMI shield 136-d may be provided within a threshold distance of each other such that a relatively small gap exists in between the first EMI shield 135-d and the second EMI shield 136-d. In some examples, the overlapping design depicted in the diagram 400-b (e.g., in which the overhang is overlapping with the flange) necessitates that EM waves travel through a complex (e.g., torturous) path in order to escape from the interface between the first EMI shield 135-d and the second EMI shield 136-d, which may reduce (e.g., significantly reduce) a strength of the EM waves thereby reducing EMI. For example, a flange may be included in (e.g., build into) the first EMI shield 135-d, which sits under an overhang included in (e.g., build into) the second EMI shield 136-d, thereby creating a complex path for EM waves that may reduce a likelihood of EM waves escaping the first EMI shield 135-d and/or the second EMI shield 136-d.

FIG. 5 illustrates exemplary diagrams 500 (e.g., a diagram 500-a, a diagram 500-b) of an optical sensor 205-a in accordance with one or more embodiments of the present disclosure. The optical sensor 205-a may be an example of an optical sensor illustrated by and described with reference to FIGS. 1, 3, and 4. For example, as depicted in the diagram 500-a, the optical sensor 205-a includes a substrate 225-a and multiple electrical components coupled to the substrate 225-a. The substrate 225-a may be an example of a substrate illustrated by and described with reference to FIGS. 1, 3, and 4. As depicted, the optical sensor 205-a may include one or more first electrical components coupled to a first region 210 of the substrate 225-a and one or more second electrical components coupled to a second region 211.

In some examples, the optical sensor 205-a (e.g., an electronic system) may include multiple electrical components, such as a laser diode and a current source for the laser diode (e.g., a driver). For example, as depicted in diagram 500-a, the optical sensor 205-a may include a laser diode (e.g., a VCSEL) coupled to the first region 210 of the substrate 225-a and a driver for the laser diode coupled to the second region 211 of the substrate 225-a. Accordingly, the first region 210 may include a first electrical component 215 (e.g., wire bonds for the laser diode, a subcomponent of the laser diode) and the second region 211 may include a second electrical component 216 (e.g., wire bonds for the driver, a subcomponent of the driver). The first electrical component 215 and the second electrical component 216 may be examples of a first electrical component and a second electrical component, respectively, illustrated by and described with reference to FIGS. 1 and 4. For example, first electrical component 215 and the second electrical component 216 may be configured to emit EM waves. In other words, the first electrical component 215 and the second electrical component 216 (e.g., respective wire bonds for the laser diode and associated driver, respectively) may be EM wave emitting sources. As depicted, the first electrical component 215 may emit EM waves 220 and the second electrical component 216 may emit EM waves 121.

In some embodiments, as depicted in diagram 500-b, the optical sensor 205-a may include an EMI shield 235-a, which may be used to provide localized EMI shielding for multiple EM wave emitting sources (e.g., multiple sources of EM radiation, such as the first electrical component 215 and the second electrical component 216) within the electronic system. In at least one example embodiment, the EMI shield 235-a may be used to provide localized EMI shielding for multiple EM wave emitting sources (e.g., the first electrical component 215 and the second electrical component 216) within the two regions (e.g., two separate regions, the first region 210 and the second region 211) of the substrate 225-a. For example, the EMI shield 235-a may be coupled to the first region 210 and may span the first region 210 and at least a portion of the second region 211. That is, the optical sensor 205-a may use a single shielding element (e.g., the EMI shield 235-a) to provide localized shielding for the first electrical component 215-a nd the second electrical component 216. In other words, a single component (e.g., the EMI shield 235) may be installed on the substrate 225-a of the optical sensor 205 (e.g., coupled to the substrate 225-a) to provide a conductive envelopment for the first electrical component 215 and the second electrical component 216 (e.g., both the VCSEL driver and the VCSEL). In some examples, the EMI shield 235 may be coupled to the substrate 225-a via one or more conductive connections (e.g., to a grounding pad 230-a).

The EMI shield 235-a may include a conductive material. In some embodiments, the EMI shield 235-a may include (e.g., be molded with) resin. In some such embodiments, the EMI shield 235-a may include a metal layer (e.g., a copper layer). For example, the metal layer may be plated on an underside of the EMI shield 235-a. Accordingly, the EMI shield 235-a (e.g., the EMI shielding element) may provide a conductive envelopment. That is, a shielding element (e.g., the EMI shield 235-a), when installed on the substrate 225-a (e.g., within a module that includes the optical sensor 205-a) above one or more EM wave emitting sources (e.g., the first electrical component 215 and the second electrical component 216), provides a conductive envelopment over the one or more EM wave emitting sources, thereby shielding EM waves emitted from the one or more EM wave emitting sources (e.g., any emitted EM waves) from exiting the module and/or affecting one or more other components withing the module (e.g., the metal layer provides a conductive shielding element around the emissions sources and forms an effective localized EMI shield). In other words, a localized conductive envelopment provided by the EMI shield 235 may reduce a likelihood of EM waves from an electrical component within an electronic system (e.g., the first electrical component 215 and the second electrical component 216) from affecting one or more other electrical components within the electronic system and/or one or more electrical components outside of the electronic system.

For example, the EMI shield 235-a may provide a conductive envelopment around one or more electrical components within the first region 210 and the second region 211 (e.g., one or more electrical components coupled to first region 210 and the second region 211), including, but not limited to, the first electrical component 215 and the second electrical component 216. Accordingly, in some examples, the EMI shield 235-a may attenuate the EM waves 220 and the EM waves 221 (e.g., via a Faraday cage effect in which external electrical fields of the EM waves 220 and the EM waves 221 cause electric charges within the conductive material of the EMI shield 235-a to be distributed in a manner that cancels out the electrical fields' effect inside the Faraday cage), such that a likelihood of the EM waves 220 and the EM waves 221 affecting one or more other electrical components may be reduced. In other words, the EMI shield 235 may substantially isolate the EM waves 220 and the EM waves 221 (which are emitted from the first electrical component 215 and the second electrical component 216) from other electrical components, such as one or more electrical components within the optical sensor 205-*a* and/or one or more electrical components outside of the optical sensor 205-*a*.

FIGS. 6A and 6B illustrate perspective views 600 (e.g., a perspective view 600-*a* and a perspective view 600-*b*) of an EMI shield 235-*b* in accordance with one or more embodiments of the present disclosure. The EMI shield 235-*b* may be an example of the EMI shield 235-*a* illustrated by and described with reference to FIG. 5.

As depicted in the perspective view 600-*a*, the EMI shield 235-*b* includes a first surface 240 (e.g., a top surface). In some embodiments, the first surface 240 may include a resin. That is, the first surface 240 may include a resin material (e.g., an injection molded material, such as a resin). In some examples, the resin material may extend from the first surface 240 into the interior of the EMI shield 235-*b* (e.g., to some depth into the interior of the EMI shield 235-*b*). Additionally, as shown in the perspective view 600-*a*, the EMI shield 235-*b* includes an aperture 250-*a*. In some examples, the aperture 250-*a* enables one or more functionalities associated with a laser diode (e.g., above which the EMI shield 235-*b* may be mounted). For example, the EMI shield 235-*b* may include an opening (e.g., the aperture 250) above the laser diode (e.g., VCSEL) to support one or more functionalities of the laser diode (e.g., for optical function of the laser diode). In some examples, the aperture 250-*a* may enable light generated by the laser diode to pass through the EMI shield 235-*a*, such that an optical sensor, such as an optical sensor 205-*a* illustrated by and described with reference to FIG. 5, may use the laser light to perform one or more functionalities (e.g., perform optical sensing). Additionally, as depicted in the perspective view 600-*b*, the EMI shield 235-*b* includes a second surface 245 (e.g., a bottom surface/underside of an inner cavity of the EMI shield 235-*b*). In some embodiments, a metal layer (e.g., a copper layer) may be plated on the second surface 245. In other words, the inner cavity of the EMI shield 235-*b* may be plated with a conductive metal layer. The conductive metal layer may provide a conductive shielding element around one or more emissions source (e.g., may form an effective localized EM shield around the one or more emission sources).

The EMI shield 235 may be formed using one or more fabrication techniques. For example, in some embodiments, micro injection molding may be used to form the EMI shield 235 (e.g., the EMI shielding element). In some examples, the fabrication process includes selection of a suitable plastic and/or resin, which may be plated (e.g., reliably plated) with a relatively thick conductive layer. In some such examples, the plating process (e.g., plating of the conductive layer) may include a laser directed structuring (LDS) process in which a laser is used to expose conductive elements embedded in the resin and a plating process may be used to build a layer of conductive metal on one or more surfaces exposed to the laser. The plating process (e.g., plastic plating) may include, for example, electroless plating and/or chemical vapor deposition. In some examples, a thickness of the conductive layer may be based on the plating process and/or a conductive material used to form the conductive layer (e.g., a conductive metal layer). In one non-limiting example, a copper layer may be plated to a thickness of about 4 microns (micrometers) to about 12 microns using electroless plating. Alternatively, the copper layer may be plated to a thickness of about 1 micron to about 2 microns using chemical vapor deposition. In another non-limiting example, a nickel layer may be plated to a thickness of about 3 microns to about 6 microns using electroless plating. Alternatively, the nickel layer may be plated to a thickness of about 1 micron to about 2 microns using chemical vapor deposition. In some examples, the use of plastics and/or resins to form the EMI shield 235-*b* may reduce a likelihood of shorting other conductive elements, for example, when the shielding element is placed onto the substrate. In some embodiments, the EMI shield 235-*b* may include one or more protrusions, including a protrusion 260-*a*, extending from one or more cavity walls of the EMI shield 235. In some such examples, the one or more protrusions and the second surface 245 (e.g., the underside of the EMI shield 235) may be plated with conductive layer.

Although the foregoing descriptions of FIGS. 6A and 6B, and the associated drawings, describes example embodiments in the context of certain example configurations of the EMI shield 235, it should be appreciated that different configurations of the EMI shield 235 may be provided by alternative embodiments without departing from the scope of the appended claims. In this regard, for example, different configurations of the EMI shield 235 than those explicitly described above are also contemplated as may be set forth in some of the appended claims.

FIG. 7 illustrates diagrams 700 (e.g., a diagram 700-*a* and a diagram 700-*b*) of an optical sensor 205-*b* in accordance with one or more embodiments of the present disclosure. The optical sensor 205-*b* may be an example of the optical sensor illustrated by and described with reference to FIG. 4. For example, the optical sensor may include an EMI shield 235-*c*, which may be coupled to a substrate 225-*b* via one or more conductive connections (e.g., to one or more grounding pads, such as a grounding pad 230-*b*). That is, the EMI shield 235-*c* may include one or more protrusions, such as a protrusion 260-*b*, which may be coupled to the grounding pad 230-*b* (e.g., for grounding). In some examples, the EMI shield 235-*c* and the substrate 225-*b* are examples of an EMI shield and a substrate, respectively, illustrated by and described with reference to FIGS. 4, 5A, and 5B. For example, the EMI shield 235-*c* may be coupled to the substrate 225-*b* via one or more conductive connections, such that the EMI shield 235-*c* may be grounded to the substrate 225-*b* (e.g., for grounding). In some examples, the EMI shield 235-*c* may be coupled to the substrate 225-*b* via a conductive adhesive and/or solder. In some examples, grounding of the EMI shield 235-*b* may be dependent on a frequency range (e.g., a target frequency ranges) of the EM waves being emitted. In some examples, the EMI shield 235-*c* may be grounded onto one or more ground pads (e.g., a grounding pad 230-*b*) on the substrate 225-*b* using conductive adhesives and/or soldered to catered grounding points.

FIG. 8 illustrates a diagram 800 of an optical sensor 205-*c* in accordance with one or more embodiments of the present disclosure. The optical sensor 205-*c* may be an example of an optical sensor illustrated by and described with reference to FIGS. 5 and 7. For example, as depicted in the diagram 800, the optical sensor 205-*c* includes a substrate 225-*c*. In some embodiments, the optical sensor 205-*c* may include multiple electrical components coupled to the substrate 225-*c*. For example, the optical sensor 205-*c* may include multiple electrical components that are coupled to (e.g., mounted on) the top surface of the substrate 225-*c* via a conductive connection. In some embodiments, one or more of the multiple electrical components may be configured to emit EM waves.

As depicted in the diagram 800, the optical sensor 205-*c* may include an EMI shield 235-*d*. The EMI shield 235-*d* may be an example of an EMI shield illustrated by and described with reference to FIGS. 5, 6A, 6B, and 7. For example, the EMI shield 235-*d* may provide localized EMI shielding for the one or more EM wave emitting sources (e.g., multiple sources of EM radiation). In at least one example embodiment, the EMI shield 235-*d* may be used to provide localized EMI shielding for one or more electrical components configured to emit EM waves (e.g., one or more EM wave emitting sources, such as the first electrical component 215 and the second electrical component 216 illustrated by and described with reference to FIG. 5). In some examples, the EMI shield 235 may be coupled to the substrate 225-*c* via one or more conductive connections (e.g., to one or more grounding pads). As depicted in FIG. 8, the optical sensor 205-*c* may also include a lens 255. The lens 255 may be an example of a lens illustrated by and described with reference to FIG. 3. For example, the lens 255 may be coupled to (e.g., mounted on) a top surface of the EMI shield 235-*d*. In some examples, the lens 255 may be substantially aligned with an aperture (e.g., the aperture 250 illustrated by and described with reference to FIGS. 6A and 7), for example, to facilitate one or more functions associated with the optical sensor 205-*c*.

FIG. 9 illustrates a diagram 900 of an optical sensor 305 in accordance with one or more embodiments of the present disclosure. The optical sensor 305 may be an example of an optical sensor illustrated by and described with reference to FIGS. 1, 2A, 2B, 3A, 4, 5, 6A, 6B, 7, and 8. For example, as depicted in the diagram 900, the optical sensor 305 includes a substrate 325 and multiple electrical components coupled to the substrate 325. In some examples, the optical sensor 305 may include one or more first electrical components coupled to a first region of the substrate 325 and one or more second electrical components coupled to a second region of the substrate 325. In some examples, the optical sensor 305 (e.g., an electronic system) may include multiple electrical components that are configured to emit EM waves, such as a laser diode and a current source for the laser diode (e.g., an electrical component 316, which may include wire bonds). In other words, the electrical component 316 (e.g., and one or more other electrical components coupled to the second region and/or the first region) may be EM wave emitting sources.

In some embodiments, the optical sensor 305 includes an EMI shield 335-*a*, which may be coupled to (e.g., mounted on) the first region of the substrate 325. The EMI shield 335-*a* may be an example of an EMI shield illustrated by and described with reference to FIGS. 1, 2A, 2B, 3A, 4, 5, 6A, 6B, 7, and 8. For example, the EMI shield 335-*a* may include a protrusion 360-*a*. In some embodiments, the protrusion 360-*a* may extend over the second region.

In some embodiments, as depicted in the diagram 900, the EMI shield 335-*a* may be used to provide localized EMI shielding for multiple EM wave emitting sources (e.g., multiple sources of EM radiation, such as the electrical component 316) within the electronic system. In at least one example embodiment, the EMI shield 335-*a* may be used to provide localized EMI shielding for multiple EM wave emitting sources within the two regions (e.g., two separate regions) of the substrate 325. For example, the EMI shield 335-*a* may be coupled to the first region and may include the protrusion 360-*a* (e.g., an overhang) that extends into (e.g., over) the second region. Accordingly, the EMI shield 335-*a* may form a conductive envelopment over the first region and the conductive envelopment may be extended over the second region via the protrusion 360-*a*. That is, the optical sensor 305 may use a single shielding element (e.g., the EMI shield 335-*a*) with an overhang (e.g., the protrusion 360-*a*) to provide localized shielding above extended emission sources (e.g., for the electrical component 316). In other words, a single component (e.g., the EMI shield 335-*a*) may be installed on the substrate 325 of the optical sensor 305 to provide a conductive envelopment for multiple electrical components coupled to multiple regions of the substrate (e.g., both the laser diode and the current source for the laser diode).

As depicted in FIG. 9, the optical sensor 305 may also include a lens 355. The lens 355 may be an example of a lens illustrated by and described with reference to FIGS. 3 and 8. For example, the lens 355 may be coupled to (e.g., mounted on) a top surface of the EMI shield 335-*a*. In some examples, the lens 355 may be substantially aligned with an aperture in the EMI shield 335-*a*, for example, to facilitate one or more functions associated with the optical sensor 305.

FIGS. 10A and 10B illustrate perspective views 1000 (e.g., a perspective view 1000-*a* and a perspective view 1000-*b*) of an EMI shield 335-*b* in accordance with one or more embodiments of the present disclosure. The EMI shield 335-*b* may be an example of the EMI shield 335-*a* illustrated by and described with reference to FIG. 9. For example, the EMI shield 335-*b* may include a protrusion 360-*b*, which may be an example of the protrusion 360-*a* illustrated by and described with reference to FIG. 9. In some examples, the EMI shield 335-*b* includes a first surface (e.g., a top surface) and a second surface (e.g., a bottom surface, an underside of the EMI shield 335-*b*). Additionally, as illustrated in the perspective views 1000, the EMI shield 335-*b* includes an aperture 350. In some examples, the aperture 350 enables one or more functionalities associated with the laser diode (e.g., above which the EMI shield 335-*b* may be mounted). For example, the EMI shield 335 may include an opening (e.g., the aperture 350) above the laser diode (e.g., VCSEL) for optical function of an optical sensor, such as the optical sensor 305 illustrated by and described with reference to FIG. 9. For example, the aperture 350 may enable light generated by the laser diode to pass through the EMI shield 335-*b*, such that the optical sensor may use the laser light to perform one or more functionalities (e.g., perform optical sensing). In some examples, a lens, such as the lens 355 illustrated by and described with reference to FIG. 9, may be coupled to the top surface of the EMI shield 335-*b* and may be substantially aligned with the aperture 350.

The EMI shield 335 may be formed using one or more fabrication techniques. In some examples, the EMI shield 335 may be included in a relatively small optical sensor (e.g., the optical sensor 305 illustrated by and described with reference to FIG. 9, which may be included in one or more devices, such as a mobile phone), which may include relatively small electrical components. In some such examples, due to the relatively small size of the optical sensor (e.g., the optical module), and one or more electrical components for which the EMI shield 335-*b* may provide shielding, micro fabrication techniques may be used for fabrication of the EMI shield 335-*b*. Some such microfabrication techniques include micro subtractive manufacturing, metal injection molding, micro stamping, and/or cast injection molding processes.

Although the foregoing descriptions of FIGS. 10A and 10B, and the associated drawings, describes example embodiments in the context of certain example configurations of the EMI shield 335, it should be appreciated that different configurations of the EMI shield 335 may be provided by alternative embodiments without departing from the scope of the appended claims. In this regard, for example, different configurations of the EMI shield 335 than those explicitly described above are also contemplated as may be set forth in some of the appended claims.

FIG. 11 illustrates an exemplary diagram 1100 of optical sensors 405 (e.g., an optical sensor 405-a, an optical sensor 405-b) in accordance with one or more embodiments of the present disclosure. In some embodiments, the optical sensor 405-a may be an example of an optical sensor illustrated by and described with reference to FIGS. 1, 3, 4, 5, 7, 8, and 9. For example, the optical sensor 405-a may an EMI shield 435-a coupled to a first region of a substrate 425-a. Additionally, the optical sensor 405-a may include a cover 440-a coupled to the substrate 425-a, such that the EMI shield 435-a is included inside of the cover 440-a. In other words, the cover 440-a may form an enclosure around the first region and one or more other regions of the substrate 425-a (e.g., the entire substrate 425-a) and, as such, may form an enclosure around the EMI shield 435-a (e.g., such that the EMI shield 435-a is inside of the enclosure). That is, the cover 440-a may be coupled to the substrate 425-a of the optical sensor 405-a, and may form an enclosure around the first region and the at least one other region of the substrate 425-a, such that the EMI shield 435-a is inside the enclosure. In some embodiments, the EMI shield 435-a may be mounted above (and thus may provide EMI shielding to) one or more electrical components, such as an electrical component 415-a.

In some examples, the EMI shield 435-a and the cover 440-a may include apertures (e.g., the EMI shield 435-a and the cover 440-a may each include a respective aperture, which may be substantially aligned with each other). In some examples, the apertures may enable one or more functionalities associated with the electrical component 415-a. For example, the electrical component 415-a may be an example of a laser diode (e.g., above which the EMI shield 435-a and the cover 440-a may be mounted). For example, the EMI shield 435-a and the cover 440-a may include openings (e.g., the apertures) above the laser diode (e.g., a VCSEL) to support one or more functionalities of the laser diode (e.g., for optical function of the laser diode). In some examples, the apertures may enable light 450-a generated by the electrical component 415-a (e.g., the laser diode) to pass through the EMI shield 435-a and the cover 440-a, such that the optical sensor 405-a may use the light 450-a to perform one or more functionalities (e.g., perform optical sensing). In some examples, the aperture of the EMI shield 435-a may have a width (e.g., diameter) $X_1$.

As depicted in the diagram 1100, an optical sensor 405-b may an EMI shield 435-b coupled to a substrate 425-b. Additionally, the optical sensor 405-b may include a cover 440-b coupled to the substrate 425-b, such that the cover 440-b is inside of the EMI shield 435-b. In some examples, the EMI shield 435-b may be included in packaging of the optical sensor 405-b and/or a device which may include the optical sensor 405-b. In other words, the EMI shield 435-b may provide package-level EMI shielding. In some examples, the EMI shield 435-b and the cover 440-b may include apertures (e.g., the EMI shield 435-b and the cover 440-b may each include a respective aperture, which may be substantially aligned with each other). In some examples, the apertures may enable one or more functionalities associated with the electrical component 415-b. For example, the electrical component 415-b may be an example of a laser diode (e.g., above which the EMI shield 435-b and the cover 440-b may be mounted). For example, the EMI shield 435-b and the cover 440-b may include openings (e.g., the apertures) above the laser diode (e.g., a VCSEL) to support one or more functionalities of the laser diode (e.g., for optical function of the laser diode). In some examples, the apertures may enable light 450-b generated by the electrical component 415-b (e.g., the laser diode) to pass through the EMI shield 435-b and the cover 440-b, such that the optical sensor 405-b may use the light 450-b to perform one or more functionalities (e.g., perform optical sensing). In some examples, the aperture of the EMI shield 435-b may have a width (e.g., diameter) $X_2$.

As depicted in the diagram 1100, the EMI shield 435-a may be an example of an EMI shielding element located inside of the cover 440-a (e.g., packaging associated with the optical sensor 405-a). In other words, the EMI shield 435-a may be an example of an EMI shielding element located inside of (e.g., solely within) a microelectronic module packaging outline, such that the microelectrical component packaging outline and/or device-level (e.g., system level) integration may be unchanged by the inclusion of the EMI shield 435-a. Additionally, as depicted, the EMI shield 435-b may be an example of an EMI shielding element located outside of the cover 440-b (e.g., packaging associated with the optical sensor 405-b). In other words, the EMI shield 435-b may be an example of an EMI shielding element located outside of a microelectronic module packaging outline, such that the microelectrical component packaging outline and/or device-level (e.g., system level) integration may be changed (e.g., increased) by the inclusion of the EMI shield 435-b (e.g., an externally mounted metal can shield).

The EMI shield 435-a (e.g., a localized shielding element) may be closer to a radiated EM source than the EMI shield 435-b. That is, a distance between the EMI shield 435-a and the electrical component 415-a may be less than a distance between the EMI shield 435-b and the electrical component 415-b. In some examples, such as examples in which an EMI shield may be closer to a radiated EM source, openings in the EM shield (e.g., to cater for the passage of light for an optical sensor to function) may be narrower compared to EMI shields further from the radiated EM sources (e.g., compared to shielding applied to the packaging of the module, compared to packaging-level shielding), thereby providing shielding for higher frequencies radiated EM waves. In other words, the aperture in the EMI shield 435-a may be narrower than the aperture in the EMI shield 435-b (e.g., $X_1 < X_2$) due to the distance between the EMI shield 435-a and the electrical component 415-a being less than the distance between the EMI shield 435-b and the electrical component 415-b. Accordingly, in some examples, the EMI shield 435-a may provide shielding for higher frequencies EM waves than the EMI shield 435-b. In some examples, EMI shielding elements mounted internally to a cover of an device, such as the EMI shield 435-a, may provide localized EMI shielding for one or more particular areas of the device and, as such, may reduce the occurrence of EMI cross talk between components within the device. That is, in some examples, internally mounted EMI shielding elements, such as the EMI shield 435-a, may provide localized EMI shielding for one or more particular areas of a substrate and, as such, may reduce the occurrence of EMI cross talk between components within an external cover (e.g., the module packaging). In other words, by mounting the localised EMI shielding element within the module packaging (e.g., the cover 440-*a*), the localised EMI shielding element may reduce the occurrence of EMI cross talk within the module packaging.

In some examples, the present disclosure provides for EMI shields that may be used in conjunction with one or more other EMI shielding technologies. For example, in the case of packaging-level shielding, the introduction of an internal EMI shielding element (e.g., the EMI shield 435-*a*) over relatively more EMI sensitive electrical components (e.g., surface-mount technology (SMT) components or emitters) may reduce EMI shielding constraints associated with the package-level shielding (e.g., at higher frequencies, which are prone to EM wave leakage in small shield openings present at apertures and/or substrate-shield interfaces). In other words, in some examples, a Faraday cage provided by the EMI shield 435-*a* may be used in complement to one or more other EMI shielding technologies to provide for improved (e.g., comprehensive) EMI shielding for a device.

In some examples, the application of a localized EMI shielding element, such as the EMI shield 435-*a*, may not necessitate modifications to a device outline (e.g., the optical sensor module outline) nor necessitate an increase in the device footprint (e.g., for implementation of the EMI shielding element at the substrate level and/or at the system level). As depicted in FIG. 11, a smaller optical aperture in the localised EMI shielding (e.g., the EMI shield 435-*a*) may be used to provide for shielding for higher frequencies.

FIG. 12 illustrates a flowchart 1200 of operations for EMI shielding in an optical sensor in accordance with one or more embodiments of the present disclosure. Specifically, FIG. 12 illustrates operations of an example process for forming an EMI shield configured or EMI shielding in accordance with at least some example embodiments of the present disclosure. The process may be implemented in an optical sensor illustrated by and described with reference to FIGS. 1, 3, 4, 5, 7, 8, 9, and 11. In some embodiments, the process may begin after one or more operations of another process and/or sub-process. For example, in some embodiments, the process depicted and described with respect to FIG. 12 may begin after one or more operations performed to fabricate one or more EMI shielding elements. In some embodiments, the flow ends upon completion of the operations as depicted and described with respect to FIG. 12. In some other embodiments, the flow ends upon completion of one or more other operations performed, for example, using the optical sensor.

At operation 1201, the method may include coupling a plurality of electrical components to a substrate. The plurality of electrical components may include one or electrical components illustrated by and described with reference to FIG. 1. For example, the plurality of electrical components may include a first electrical component (e.g., a laser diode) and second electrical component (e.g., a current sources associated with the laser diode). In some embodiments, the first electrical component may be coupled to a first region and at least one other electrical component (e.g., the second electrical component and/or one or more other electrical components) may be coupled to at least one other region of the substrate. In some examples, the first electrical component (e.g., and the second electrical component) may be configured to emit EM waves.

At operation 1202, the method may include coupling a first EMI shield to the substrate. The first EMI shield may be an example of an EMI shield illustrated by and described with reference to FIGS. 1, 2A, 2B, 3-5, 6A, 6B, 7-9, 10A, 10B, and 11. For example, the first EMI shield may form a first conductive envelopment around at least the first region. Accordingly, in some examples, the first electrical component may be inside the first conductive envelopment and the at least one other electrical component may be outside of the first conductive envelopment. In some examples, the first EMI shield includes a first aperture positioned above the first electrical component (e.g., to allow for the passage of light through the first EMI shield).

At operation 1203, the method may include coupling a lens to the first EMI shield. The lens may be an example of a lens illustrated by and described with reference to FIGS. 3, 4, 8, and 9. For example, the lens may be positioned above the first electrical component and substantially aligned with the first aperture. In some examples, the lens may be mounted on a first surface (e.g., a top surface) of the first EMI shield.

At operation 1204, the method may include coupling a cover to the substrate. The cover may be an example of the cover 440-*a* illustrated by and described with reference to FIG. 11. For example, the cover may form an enclosure around the first region and the at least one other region of the substrate, such that the first EMI shield is inside the enclosure. In some examples, the cover may include a second aperture that is substantially aligned with the lens (e.g., to enable the passage of light through the cover). In some examples, the method may also include grounding the first EMI shield onto the substrate via at least one conductive connection. In some such examples, the at least one conductive connection may include a conductive adhesive and/or solder.

In some examples, the first EMI shield may create a Faradays cage through enveloping the first electrical component (e.g., inside of the cover), which may reduce component and assembly costs. Additionally, or alternatively, the first EMI may avoid increases in weight and/or volume at the integrated system level. In other words, the present disclosure provides for one or more localized EMI shield which are placed directly over one or more particular components or regions on an optical sensor module substrate and within the packaging of the optical sensor module to create one or more localized conductive envelopments. The present disclosure may provide for localized radiated EMI shielding, for example, without necessitating changes to the module outline (e.g., the overall module outline) or the system integration constraints and reduces the likelihood of EMI cross talk between components within the optical sensor module.

It should be readily appreciated that the embodiments of the systems and apparatuses, described herein may be configured in various additional and alternative manners in addition to those expressly described herein.

CONCLUSION

Operations and/or functions of the present disclosure have been described herein, such as in flowcharts. The flowchart blocks support combinations of means for performing the specified operations and/or functions and combinations of operations and/or functions for performing the specified operations and/or functions. It will be understood that one or more blocks of the flowcharts, and combinations of blocks in the flowcharts, can be implemented by special purpose hardware-based computer systems which perform the specified operations and/or functions, or combinations of special purpose hardware with computer instructions.

While this specification contains many specific embodiments and implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

While operations and/or functions are illustrated in the drawings in a particular order, this should not be understood as requiring that such operations and/or functions be performed in the particular order shown or in sequential order, or that all illustrated operations be performed, to achieve desirable results. In certain circumstances, operations and/or functions in alternative ordering may be advantageous. In some cases, the actions recited in the claims may be performed in a different order and still achieve desirable results. Thus, while particular embodiments of the subject matter have been described, other embodiments are within the scope of the following claims.

While this detailed description has set forth some embodiments of the present invention, the appended claims cover other embodiments of the present invention which differ from the described embodiments according to various modifications and improvements.

Within the appended claims, unless the specific term "means for" or "step for" is used within a given claim, it is not intended that the claim be interpreted under 35 U.S.C. § 112, paragraph 6.

The invention claimed is:

1. An apparatus comprising:
a substrate;
a plurality of electrical components coupled to the substrate, wherein the plurality of electrical components comprises a first electrical component coupled to a first region of the substrate and at least one other electrical component coupled to at least one other region of the substrate, and wherein the first electrical component is configured to emit electromagnetic waves;
a first electromagnetic interference (EMI) shield forming a first conductive envelopment around at least the first region, wherein the first electrical component is inside the first conductive envelopment and the at least one other electrical component is outside of the first conductive envelopment, and wherein the first EMI shield comprises a first aperture positioned above the first electrical component; and
a lens coupled to the first EMI shield, wherein the lens is positioned above the first electrical component, and wherein the lens is substantially aligned with the first aperture.

2. The apparatus of claim 1, further comprising:
a second EMI shield forming a second conductive envelopment around a second region of the substrate, wherein the plurality of electrical components comprises a second electrical component coupled to the second region of the substrate, wherein the second electrical component is inside the second conductive envelopment, and wherein the second electrical component is configured to emit electromagnetic waves.

3. The apparatus of claim 2, wherein:
the first EMI shield comprises a first protrusion that extends towards the second EMI shield,
the second EMI shield comprises a second protrusion that extends towards the first EMI shield, and
at least a first portion of the first protrusion is positioned under at least a second portion of the second protrusion.

4. The apparatus of claim 2, wherein:
the first EMI shield is configured to substantially isolate first electromagnetic waves associated with the first electrical component from the second electrical component; and
the second EMI shield is configured to substantially isolate second electromagnetic waves associated with the second electrical component from the first electrical component.

5. The apparatus of claim 2, wherein the first EMI shield and the second EMI shield comprise metal.

6. The apparatus of claim 1, wherein:
the plurality of electrical components comprises a second electrical component coupled to a second region of the substrate,
the second electrical component is configured to emit electromagnetic waves, and
the first EMI shield forms the first conductive envelopment around the first electrical component and at least a portion of the second electrical component.

7. The apparatus of claim 6, wherein the first EMI shield comprises a resin, and wherein an underside of the first EMI shield comprises a metal layer that forms the first conductive envelopment.

8. The apparatus of claim 7, wherein a thickness of the metal layer is about 1 micron to about 12 microns.

9. The apparatus of claim 7, wherein the metal layer comprises at least one of the following:
beryllium, copper, brass, steel, stainless steel, nickel, or silver.

10. The apparatus of claim 6, wherein the first EMI shield comprises a protrusion that extends towards the second electrical component and is positioned above the portion of the second electrical component, and wherein the protrusion extends the first conductive envelopment around the portion of the second electrical component.

11. The apparatus of claim 6, wherein the first electrical component comprises a laser diode and the second electrical component comprises a current source associated with the laser diode.

12. The apparatus of claim 1, wherein the first EMI shield comprises metal.

13. A system comprising:
an optical sensor comprising:
a substrate;
a plurality of electrical components coupled to the substrate, wherein the plurality of electrical components comprises a first electrical component coupled to a first region of the substrate and at least one other electrical component coupled to at least one other region of the substrate, and wherein the first electrical component is configured to emit electromagnetic waves;
a first electromagnetic interference (EMI) shield forming a first conductive envelopment around at least the first region, wherein the first electrical component is inside the first conductive envelopment and the at least one other electrical component is outside of the first conductive envelopment, and wherein the first EMI shield comprises a first aperture positioned above the first electrical component; and a lens coupled to the first EMI shield, wherein the lens is positioned above the first electrical component, and wherein the lens is substantially aligned with the first aperture; and a cover coupled to the substrate of the optical sensor, wherein the cover forms an enclosure around the first region and the at least one other region of the substrate, wherein the first EMI shield is inside the enclosure, and wherein the cover comprises at least a second aperture that is substantially aligned with the lens.

14. The system of claim 13, wherein:

the optical sensor further comprises a second EMI shield forming a second conductive envelopment around a second region of the substrate, the plurality of electrical components comprises a second electrical component coupled to the second region of the substrate, the second electrical component is inside the second conductive envelopment, and the second electrical component is configured to emit electromagnetic waves.

15. The system of claim 14, wherein:

the first EMI shield comprises a first protrusion that extends towards the second EMI shield, the second EMI shield comprises a second protrusion that extends towards the first EMI shield, and at least a first portion of the first protrusion is positioned under at least a second portion of the second protrusion.

16. The system of claim 13, wherein:

the plurality of electrical components comprises a second electrical component coupled to a second region of the substrate, the second electrical component is configured to emit electromagnetic waves, and the first EMI shield forms the first conductive envelopment around the first electrical component and at least a portion of the second electrical component.

17. The system of claim 16, wherein the first EMI shield comprises a resin, and wherein an underside of the first EMI shield comprises a metal layer that forms the first conductive envelopment.

18. The system of claim 16, wherein the first EMI shield comprises a protrusion that extends towards the second electrical component and is positioned above the portion of the second electrical component, and wherein the protrusion extends the first conductive envelopment around the portion of the second electrical component.

19. A method comprising:

coupling a plurality of electrical components to a substrate, wherein the plurality of electrical components comprises a first electrical component coupled to a first region of the substrate and at least one other electrical component coupled to at least one other region of the substrate, and wherein the first electrical component is configured to emit electromagnetic waves;

coupling a first electromagnetic interference (EMI) shield to the substrate, wherein the first EMI shield forms a first conductive envelopment around at least the first region, wherein the first electrical component is inside the first conductive envelopment and the at least one other electrical component is outside of the first conductive envelopment, and wherein the first EMI shield comprises a first aperture positioned above the first electrical component;

coupling a lens to the first EMI shield, wherein the lens is positioned above the first electrical component, and wherein the lens is substantially aligned with the first aperture; and coupling a cover to the substrate, wherein the cover forms an enclosure around the first region and the at least one other region of the substrate, wherein the first EMI shield is inside the enclosure, and wherein the cover comprises at least a second aperture that is substantially aligned with the lens.

20. The method of claim 19, further comprising:

grounding the first EMI shield onto the substrate via at least one conductive connection, wherein the at least one conductive connection comprises a conductive adhesive or solder.

* * * * *